(12) United States Patent
Zhang et al.

(10) Patent No.: US 12,665,571 B2
(45) Date of Patent: Jun. 23, 2026

(54) ACOUSTIC FILTER OPERATING AT BROADER PASSBAND

(71) Applicant: SKYWORKS SOLUTIONS, INC., Irvine, CA (US)

(72) Inventors: Xiao Zhang, Irvine, CA (US); Nan Wu, Irvine, CA (US); Yiliu Wang, Irvine, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 332 days.

(21) Appl. No.: 18/179,587

(22) Filed: Mar. 7, 2023

(65) Prior Publication Data

US 2023/0299744 A1 Sep. 21, 2023

Related U.S. Application Data

(60) Provisional application No. 63/319,833, filed on Mar. 15, 2022.

(51) Int. Cl.
*H03H 9/56* (2006.01)

(52) U.S. Cl.
CPC .................................. *H03H 9/568* (2013.01)

(58) Field of Classification Search
CPC ...... H03H 9/0014; H03H 9/132; H03H 9/171; H03H 9/205; H03H 9/02157;
(Continued)

(56) References Cited

U.S. PATENT DOCUMENTS

| | | | |
|---|---|---|---|
| 7,358,831 B2 | 4/2008 | Larson, III et al. | |
| 7,602,102 B1 | 10/2009 | Barber et al. | |

(Continued)

FOREIGN PATENT DOCUMENTS

| | | |
|---|---|---|
| CN | 111786645 A | 10/2020 |
| JP | 2002374144 A | 12/2002 |

(Continued)

OTHER PUBLICATIONS

Li et al., "Use of double-raised-border structure for quality factor enhancement of type II piston mode FBAR", Microsystem Technologies, Berlin, Germany, vol. 24, No. 7, May 2018, pp. 2991-2997.

*Primary Examiner* — Andrea Lindgren Baltzell
*Assistant Examiner* — Victor Cole
(74) *Attorney, Agent, or Firm* — Lando & Anastasi, LLP

(57) ABSTRACT

Acoustic wave filters operating at wider passband with enhanced frequency response are provided herein. In certain embodiments, an acoustic wave filter comprises an input port and an output port, a plurality of series resonators electrically connected in series between the input port and the output port, the plurality of series resonators including a first group of resonators and a second group of resonators, each resonator of the first group of resonators having a raised frame region, the second group of resonators including at least one resonator having its resonance frequency closest to one edge of a target passband that is closer to its anti-resonance frequency lacking any raised frame region such as to broaden a bandwidth of the target passband, and a plurality of shunt resonators each being electrically connected between respective series resonators and a ground.

18 Claims, 14 Drawing Sheets

(58) Field of Classification Search
CPC .............. H03H 9/02393; H03H 9/568; H03H 2003/0421; H03H 2003/0442; H03H 2003/045
USPC ................................................. 333/187, 193
See application file for complete search history.

(56) References Cited

U.S. PATENT DOCUMENTS

| | | | |
|---|---|---|---|
| 9,385,303 | B2 | 7/2016 | Song et al. |
| 9,401,692 | B2 | 7/2016 | Burak et al. |
| 9,425,764 | B2 | 8/2016 | Burak et al. |
| 9,444,426 | B2 | 9/2016 | Burak et al. |
| 9,484,882 | B2 | 11/2016 | Burak et al. |
| 9,490,771 | B2 | 11/2016 | Burak et al. |
| 9,577,603 | B2 | 2/2017 | Burak et al. |
| 9,853,626 | B2 | 12/2017 | Burak et al. |
| 9,991,871 | B2 | 6/2018 | Zou et al. |
| 10,284,173 | B2 | 5/2019 | Burak et al. |
| 10,367,472 | B2 | 7/2019 | Burak et al. |
| 10,404,231 | B2 | 9/2019 | Burak et al. |
| 10,608,611 | B2 | 3/2020 | Tajic et al. |
| 10,756,702 | B2 | 8/2020 | Lee et al. |
| 10,812,037 | B2 | 10/2020 | Kyoung et al. |
| 10,897,002 | B2 | 1/2021 | Jeong et al. |
| 11,050,409 | B2 | 6/2021 | Park et al. |
| 11,082,023 | B2 | 8/2021 | Shin et al. |
| 11,190,164 | B2 | 11/2021 | Yen et al. |
| 11,482,985 | B2 | 10/2022 | Fries et al. |
| 11,502,667 | B2 | 11/2022 | Tajic et al. |
| 11,601,112 | B2 * | 3/2023 | Wang ..................... H03H 9/706 |
| 11,601,113 | B2 | 3/2023 | Wang et al. |
| 12,244,297 | B2 | 3/2025 | Komatsu et al. |
| 2006/0103492 | A1 * | 5/2006 | Feng .................. H03H 9/02118 333/187 |
| 2007/0057599 | A1 | 3/2007 | Motai et al. |
| 2008/0024042 | A1 | 1/2008 | Isobe et al. |
| 2008/0174389 | A1 | 7/2008 | Mori et al. |
| 2009/0001848 | A1 | 1/2009 | Umeda et al. |
| 2010/0013573 | A1 | 1/2010 | Umeda |
| 2010/0019866 | A1 * | 1/2010 | Hara ....................... H03H 9/205 29/25.35 |
| 2011/0090026 | A1 * | 4/2011 | Nakahashi ......... H03H 9/14594 333/195 |
| 2011/0180391 | A1 | 7/2011 | Larson, III et al. |
| 2011/0298564 | A1 | 12/2011 | Iwashita et al. |
| 2011/0304412 | A1 | 12/2011 | Zhang |
| 2012/0200195 | A1 | 8/2012 | Yokoyama et al. |
| 2013/0033337 | A1 | 2/2013 | Nishihara et al. |
| 2013/0063227 | A1 | 3/2013 | Burak et al. |
| 2013/0106248 | A1 | 5/2013 | Burak et al. |
| 2013/0140959 | A1 | 6/2013 | Shin et al. |
| 2013/0193809 | A1 | 8/2013 | Araki |
| 2014/0118091 | A1 | 5/2014 | Burak et al. |
| 2014/0118092 | A1 | 5/2014 | Burak et al. |
| 2014/0167566 | A1 | 6/2014 | Kando |
| 2014/0203684 | A1 | 7/2014 | Yamamoto et al. |
| 2014/0203686 | A1 | 7/2014 | Song et al. |
| 2014/0292150 | A1 | 10/2014 | Zou et al. |
| 2014/0339959 | A1 | 11/2014 | Lee et al. |
| 2015/0214923 | A1 | 7/2015 | Tsuzuki |
| 2016/0028371 | A1 | 1/2016 | Nishihara et al. |
| 2016/0118957 | A1 | 4/2016 | Burak et al. |
| 2016/0118958 | A1 | 4/2016 | Burak et al. |
| 2016/0164487 | A1 | 6/2016 | Shin et al. |
| 2017/0033769 | A1 | 2/2017 | Yokoyama |
| 2017/0093374 | A1 | 3/2017 | Yatsenko et al. |
| 2017/0214388 | A1 | 7/2017 | Rieda et al. |
| 2017/0244021 | A1 | 8/2017 | Han et al. |
| 2017/0244387 | A1 | 8/2017 | Matsuda et al. |
| 2017/0264267 | A1 * | 9/2017 | Tajic .................. H03H 9/02118 |
| 2017/0288121 | A1 | 10/2017 | Burak et al. |
| 2017/0288122 | A1 | 10/2017 | Zou et al. |
| 2017/0331457 | A1 | 11/2017 | Satoh |
| 2018/0013401 | A1 | 1/2018 | Lee et al. |
| 2018/0048287 | A1 | 2/2018 | Lee et al. |
| 2018/0085787 | A1 | 3/2018 | Burak et al. |
| 2018/0115302 | A1 | 4/2018 | Yeh et al. |
| 2018/0219528 | A1 | 8/2018 | Liu et al. |
| 2018/0254764 | A1 | 9/2018 | Lee et al. |
| 2018/0278231 | A1 | 9/2018 | Hurwitz |
| 2018/0309427 | A1 | 10/2018 | Kim et al. |
| 2018/0351533 | A1 | 12/2018 | Lee et al. |
| 2019/0036592 | A1 | 1/2019 | Shealy et al. |
| 2019/0115901 | A1 | 4/2019 | Takahashi et al. |
| 2019/0326873 | A1 | 10/2019 | Bradley et al. |
| 2019/0363692 | A1 | 11/2019 | Nosaka |
| 2020/0021273 | A1 | 1/2020 | Sung et al. |
| 2020/0083861 | A1 | 3/2020 | Matsuo et al. |
| 2020/0099359 | A1 | 3/2020 | Shin et al. |
| 2020/0119713 | A1 | 4/2020 | Kim et al. |
| 2020/0168785 | A1 | 5/2020 | Keuchi et al. |
| 2020/0204148 | A1 | 6/2020 | Kim et al. |
| 2020/0274520 | A1 | 8/2020 | Shin et al. |
| 2020/0350888 | A1 | 11/2020 | Moulard |
| 2020/0366266 | A1 | 11/2020 | Pollard et al. |
| 2020/0366271 | A1 | 11/2020 | Kim et al. |
| 2020/0373901 | A1 | 11/2020 | Liu et al. |
| 2020/0373911 | A1 * | 11/2020 | Wang .................. H03H 9/1014 |
| 2021/0028765 | A1 * | 1/2021 | Wang .................... H03H 9/564 |
| 2021/0075391 | A1 * | 3/2021 | Matsuo ............. H03H 9/02118 |
| 2021/0083643 | A1 | 3/2021 | Liu et al. |
| 2022/0311419 | A1 | 9/2022 | Komatsu et al. |
| 2022/0368312 | A1 | 11/2022 | Wang et al. |
| 2022/0393664 | A1 | 12/2022 | Liu et al. |
| 2023/0006642 | A1 | 1/2023 | Liu et al. |
| 2023/0109382 | A1 | 4/2023 | Liu et al. |
| 2023/0188115 | A1 | 6/2023 | Hatano |
| 2023/0261637 | A1 | 8/2023 | Matsuo et al. |

FOREIGN PATENT DOCUMENTS

| | | | |
|---|---|---|---|
| JP | 2007208845 A | | 8/2007 |
| JP | 2007288645 A | | 11/2007 |
| JP | 2014090414 A | | 5/2014 |
| JP | 2017158160 A | * | 9/2017 |
| WO | 2006129532 A1 | | 12/2006 |
| WO | 2007119556 A1 | | 10/2007 |
| WO | 2008126473 A1 | | 10/2008 |
| WO | 2019029912 A1 | | 2/2019 |

* cited by examiner

ACOUSTIC FILTER OPERATING AT BROADER PASSBAND

CROSS-REFERENCE TO RELATED APPLICATIONS

This application claims priority under 35 U.S.C. § 119(e) to U.S. Provisional Patent Application Ser. No. 63/319,833, titled "ACOUSTIC FILTER OPERATING AT BROADER PASSBAND," filed Mar. 15, 2022, the entire content of which is incorporated herein by reference in its entirety for all purposes.

BACKGROUND

Technical Field

Aspects and embodiments disclosed herein relate to electronic systems, and in particular, to a filter for use in radio frequency (RF) electronics.

Description of the Related Technology

Filters are used in radio frequency (RF) communication systems to allow signals to pass through at discreet frequencies but reject signals having frequencies outside of the specified range. An acoustic wave filter, which is used widely in the wireless communication field, can include a plurality of resonators arranged to filter a radio frequency signal. Example acoustic wave filters include surface acoustic wave (SAW) filters and/or bulk acoustic wave (BAW) filters. A film bulk acoustic resonator (FBAR) filter is an example of a BAW filter. Acoustic wave filters can be implemented in radio frequency electronic systems. For instance, filters in a radio frequency front end of a mobile phone can include acoustic wave filters. A plurality of acoustic wave filters can be arranged as a multiplexer. For example, two surface acoustic wave filters can be arranged as a duplexer.

Examples of RF communication systems with one or more filter modules include, but are not limited to, mobile phones, tablets, base stations, network access points, customer-premises equipment (CPE), laptops, and wearable electronics. For example, in wireless devices that communicate using a cellular standard, a wireless local area network (WLAN) standard, and/or any other suitable communication standard, a power amplifier can be used for RF signal amplification. An RF signal can have a frequency in the range of about 30 kHz to 300 GHz, such as in the range of about 410 MHz to about 7.125 GHz for certain communications standards.

SUMMARY

First Aspect

In accordance with one aspect, there is provided an acoustic wave filter configured to allow signals to pass at a target passband. The acoustic wave filter comprises an input port and an output port, a plurality of series resonators electrically connected in series between the input port and the output port, the plurality of series resonators including a first group of resonators and a second group of resonators, each resonator of the first group of resonators having a raised frame region configured to improve a quality (Q) factor at a frequency range on a side of an anti-resonance frequency with respect to a resonance frequency, the second group of resonators including at least one resonator having its resonance frequency closest to one edge of the target passband that is closer to its anti-resonance frequency lacking any raised frame region such as to broaden a bandwidth of the target passband, and a plurality of shunt resonators electrically connected between nodes between adjacent series resonators and a ground.

In some embodiments, each resonator of the plurality of series resonators and the plurality of shunt resonators is one of a bulk acoustic wave (BAW) resonator, a film bulk acoustic wave resonator (FBAR), or a solidly mounted resonator (SMR).

In some embodiments, the second group of resonators lacking any raised frame region includes more than one resonator in order of closest distance in frequency between a respective resonance frequency and an upper edge of the target passband of the acoustic wave filter.

In some embodiments, the raised frame region is defined by an area where at least a top electrode layer or a dielectric material layer on top of a top electrode layer is thicker than a top electrode layer or a dielectric layer of an active region of a resonator in the first group of resonators.

In some embodiments, each resonator in the first group of resonators includes a recessed frame region where the dielectric material layer on top of the top electrode layer is thinner than the dielectric material layer of the active region.

In some embodiments, each resonator of the second group of resonators does not include a recessed frame region where the dielectric material layer on top of the top electrode layer is thinner than the dielectric material layer of the active region.

In some embodiments, each resonator of the second group of resonators includes a recessed frame region where the dielectric material layer on top of the top electrode layer is thinner than the dielectric material layer of the active region such as to reduce insertion loss of the acoustic wave filter in the target passband.

In some embodiments, the plurality of shunt resonators includes a third group of resonators having raised frame regions and a fourth group of resonators lacking raised frame regions.

In some embodiments, the third group of resonators includes at least one shunt resonator the resonance frequency of which is closest to one edge of the target passband such as to improve a response characteristic in a rejection band of the acoustic wave filter.

In some embodiments, the acoustic wave filter is ladder-type filter.

Second Aspect

In accordance with another aspect, there is provided a radio frequency module. The radio frequency module comprises a packaging board configured to receive a plurality of components, and an acoustic wave filter implemented on the packaging board, the acoustic wave filter including an input port and an output port, a plurality of series resonators electrically connected in series between the input port and the output port, the plurality of series resonators including a first group of resonators and a second group of resonators, each resonator of the first group of resonators having a raised frame region configured to improve a quality (Q) factor at a frequency range on a side of an anti-resonance frequency with respect to a resonance frequency, the second group of resonators including at least one resonator having its resonance frequency closest to one edge of the target passband that is closer to its anti-resonance frequency lacking any raised frame region such as to broaden a bandwidth of the target passband, and a plurality of shunt resonators, each of the shunt resonators being electrically connected between respective series resonators and a ground.

In some embodiments, the radio frequency module is a front-end module.

In some embodiments, each resonator of the plurality of series resonators and the plurality of shunt resonators is one of a bulk acoustic wave (BAW) resonator, a film bulk acoustic wave resonator (FBAR), or a solidly mounted resonator (SMR).

In some embodiments, the second group of resonators lacking any raised frame region includes more than one resonator in order of closest distance in frequency between a respective resonance frequency and an upper edge of the target passband of the acoustic wave filter.

In some embodiments, the raised frame region is defined by an area where at least a top electrode layer and a dielectric material layer on top of the top electrode layer is thicker than a top electrode layer or a dielectric layer of an active region of a resonator in the first group of resonators.

In some embodiments, each resonator of the first group of resonators includes a recessed frame region where the dielectric material layer on top of the top electrode layer is thinner than the dielectric material layer of the active region of the resonator in the first group of resonators.

In some embodiments, each resonator of the second group of resonators does not include a recessed frame region where the dielectric material layer on top of the top electrode layer is thinner than the dielectric material layer of the active region of a resonator in the second group of resonators.

In some embodiments, each resonator of the second group of resonators includes a recessed frame region where the dielectric material layer on top of the top electrode layer is thinner than the dielectric material layer of the active region of a resonator in the second group of resonators such as to reduce insertion loss of the acoustic wave filter in the target passband.

In some embodiments, the plurality of shunt resonators includes a third group of resonators having raised frame regions and a fourth group of resonators lacking raised frame regions.

In some embodiments, the third group of resonators includes at least one shunt resonator the resonance frequency of which is closest to one edge of the target passband such as to improve a response characteristic in a rejection band of the acoustic wave filter.

In some embodiments, the acoustic wave filter is ladder-type filter.

Third Aspect

In accordance with another aspect, there is provided a mobile device. The mobile device comprises an antenna configured to receive a radio frequency signal, and a front end system configured to communicate with the antenna, the front end system including an acoustic wave filter having an input port and an output port, a plurality of series resonators electrically connected in series between the input port and the output port, the plurality of series resonators including a first group of resonators and a second group of resonators, each resonator of the first group of resonators having a raised frame region configured to improve a quality (Q) factor at a frequency range on a side of an anti-resonance frequency with respect to a resonance frequency, the second group of resonators including at least one resonator having its resonance frequency closest to one edge of the target passband that is closer to its anti-resonance frequency lacking any raised frame region such as to broaden a bandwidth of the target passband, and a plurality of shunt resonators connected in parallel, each of the shunt resonators being electrically connected between respective series resonators and a ground.

In some embodiments, each resonator of the plurality of series resonators and the plurality of shunt resonators is one of a bulk acoustic wave (BAW) resonator, a film bulk acoustic wave resonator (FBAR), and a solidly mounted resonator (SMR).

In some embodiments, the second group of resonators lacking any raised frame region includes more than one resonator in order of closest distance in frequency between a respective resonance frequency and an upper edge of the target passband of the acoustic wave filter.

In some embodiments, the raised frame region is defined by an area where at least a top electrode layer and a dielectric material layer on top of the top electrode layer is thicker than the top electrode layer or the dielectric layer of an active region of a resonator in the first group of resonators.

In some embodiments, each resonator of the first group of resonators includes a recessed frame region where the dielectric material layer on top of the top electrode layer is thinner than the dielectric material layer of the active region of the resonator in the first group of resonators.

In some embodiments, each resonator of the second group of resonators does not include a recessed frame region where the dielectric material layer on top of the top electrode layer is thinner than the dielectric material layer of the active region of a resonator in the second group of resonators.

In some embodiments, each resonator of the second group of resonators includes a recessed frame region where the dielectric material layer on top of the top electrode layer is thinner than the dielectric material layer of the active region of a resonator in the second group of resonators such as to reduce insertion loss of the acoustic wave filter in the target passband. In some embodiments, the plurality of shunt resonators includes a third group of resonators having raised frame regions and a fourth group of resonators lacking raised frame regions.

In some embodiments, the third group of resonators includes at least one shunt resonator the resonance frequency of which is closest to one edge of the target passband such as to improve a response characteristic in a rejection band of the acoustic wave filter.

In some embodiments, the acoustic wave filter is ladder-type filter.

DETAILED DESCRIPTION OF EMBODIMENTS

Figure 1:
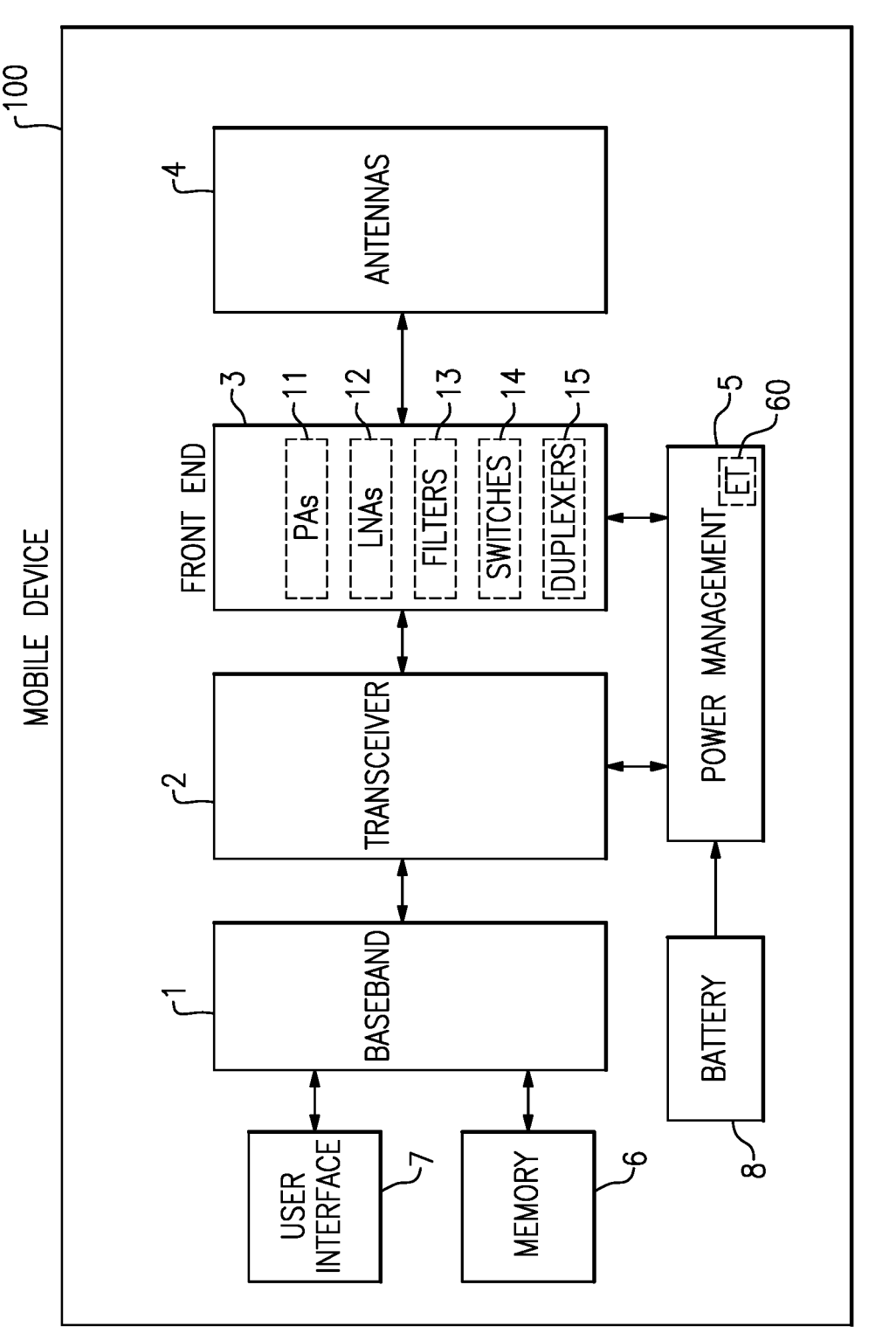
FIG. 1 is a schematic diagram of one embodiment of a mobile device.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

FIG. 1 is a schematic diagram of one example of a mobile device 100. The mobile device 100 includes a baseband system 1, a transceiver 2, a front end system 3, antennas 4, a power management system 5, a memory 6, a user interface 7, and a battery 8.

The mobile device 100 can be used communicate using a wide variety of communications technologies, including, but not limited to, 2G, 3G, 4G (including LTE, LTE-Advanced, and LTE-Advanced Pro), 5G, WLAN (for instance, Wi-Fi), WPAN (for instance, Bluetooth and ZigBee), WMAN (for instance, WiMax), and/or GPS technologies.

The transceiver 2 generates RF signals for transmission and processes incoming RF signals received from the antennas 4. It will be understood that various functionalities associated with the transmission and receiving of RF signals can be achieved by one or more components that are collectively represented in FIG. 1 as the transceiver 2. In one example, separate components (for instance, separate circuits or dies) can be provided for handling certain types of RF signals.

The front end system 3 aids in conditioning signals transmitted to and/or received from the antennas 4. In the illustrated embodiment, the front end system 3 includes power amplifiers (PAS) 11, low noise amplifiers (LNAs) 12, filters 13, switches 14, and duplexers 15. However, other implementations are possible.

For example, the front end system 3 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

In certain implementations, the mobile device 100 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous, and can include carriers separated in frequency within a common band and/or in different bands.

The antennas 4 can include antennas used for a wide variety of types of communications. For example, the antennas 4 can include antennas associated transmitting and/or receiving signals associated with a wide variety of frequencies and communications standards.

In certain implementations, the antennas 4 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 100 can operate with beamforming in certain implementations. For example, the front end system 3 can include phase shifters having variable phases controlled by the transceiver 2. Additionally, the phase shifters may be controlled to provide beam formation and directivity for transmission and/or reception of signals using the antennas 4. For example, in the context of signal transmission, the phases of the transmit signals provided to the antennas 4 are controlled such that radiated signals from the antennas 4 combine using constructive and destructive interference to generate an aggregate transmit signal exhibiting beam-like qualities with more signal strength propagating in a given direction. In the context of signal reception, the phases are controlled such that more signal energy is received when the signal is arriving to the antennas 4 from a particular direction. In certain implementations, the antennas 4 include one or more arrays of antenna elements to enhance beamforming.

The baseband system 1 is coupled to the user interface 7 to facilitate processing of various user input and output (I/O), such as voice and data. The baseband system 1 provides the transceiver 2 with digital representations of transmit signals, which the transceiver 2 processes to generate RF signals for transmission. The baseband system 1 also processes digital representations of received signals provided by the transceiver 2. As shown in FIG. 1, the baseband system 1 is coupled to the memory 6 to facilitate operation of the mobile device 100.

The memory 6 can be used for a wide variety of purposes, such as storing data and/or instructions to facilitate the operation of the mobile device 100 and/or to provide storage of user information.

The power management system 5 provides a number of power management functions of the mobile device 100. The power management system 5 of FIG. 1 includes an envelope tracker 60. As shown in FIG. 1, the power management system 5 receives a battery voltage form the battery 8. The battery 8 can be any suitable battery for use in the mobile device 100, including, for example, a lithium-ion battery.

The mobile device 100 of FIG. 1 is one example of an RF communication system that can include power amplifier(s) implemented in accordance with one or more features of the present disclosure. However, the teachings herein are applicable to RF communication systems implemented in a wide variety of ways.

Figure 2A:
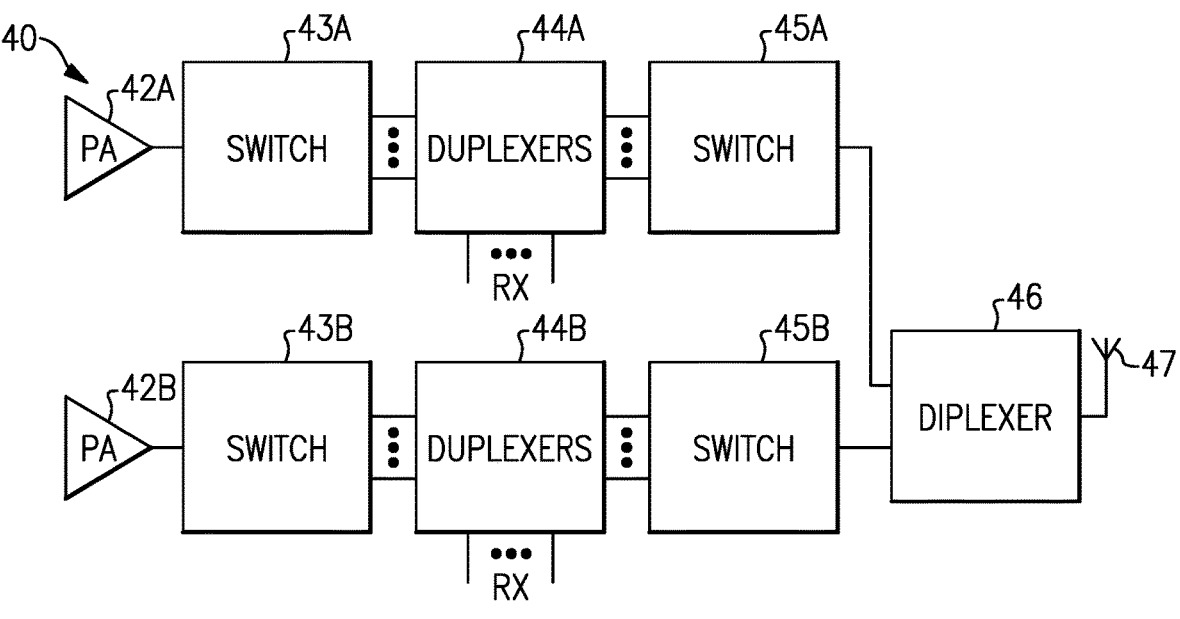
FIG. 2A is a schematic diagram of a carrier aggregation system.

FIG. 2A is a schematic diagram of a carrier aggregation system 40. The illustrated carrier aggregation system 40 includes power amplifiers 42A and 42B, switches 43A and 43B, duplexers 44A and 44B, switches 45A and 45B, diplexer 46, and an antenna 47. The power amplifiers 42A and 42B can each transmit an amplified RF signal associated with a different carrier. The switch 43A can be a band select switch. The switch 43A can couple an output of the power amplifier 42A to a selected duplexer of the duplexers 44A. Each of the duplexers can include a transmit filter and receive filter. Any of the filters of the duplexers 44A and 44B can be implemented in accordance with any suitable principles and advantages discussed herein. The switch 45A can couple the selected duplexer of the duplexers 44A to the diplexer 46. The diplexer 46 can combine RF signals provided by the switches 45A and 45B into a carrier aggregation signal that is transmitted by the antenna 47. The diplexer 46 can isolate different frequency bands of a carrier aggregation signal received by the antenna 47. The diplexer 46 is an example of a frequency domain multiplexer. Other frequency domain multiplexers include a triplexer. Carrier aggregation systems that include triplexers can process carrier aggregation signals associated with three carriers. The switches 45A and 45B and selected receive filters of the duplexers 44A and 44B can provide RF signals with the isolated frequency bands to respective receive paths.

Figure 2B:
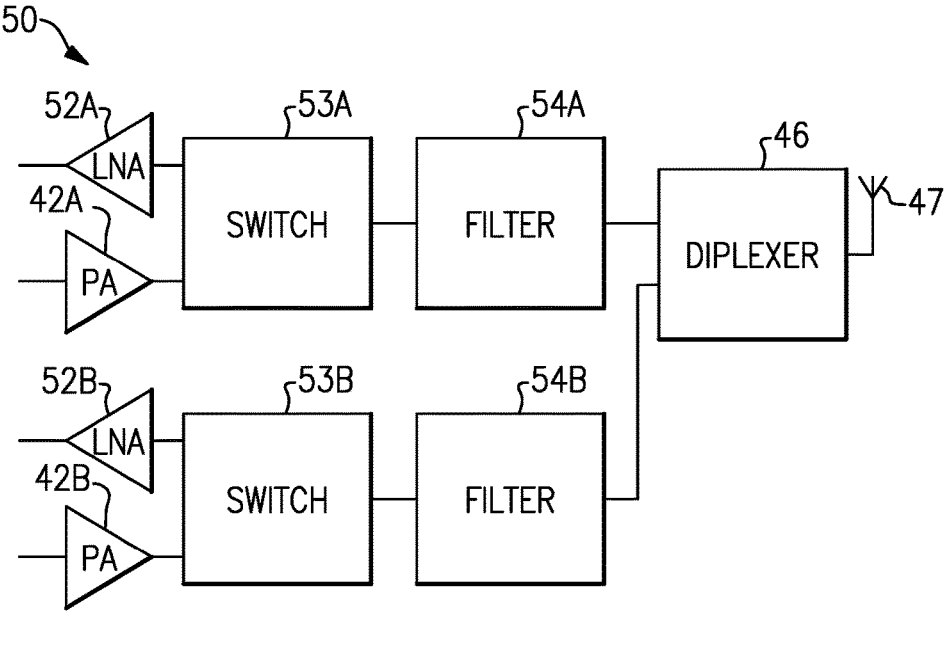
FIG. 2B is a schematic diagram of a carrier aggregation system.

FIG. 2B is a schematic diagram of a carrier aggregation system 50. The illustrated carrier aggregation system 50 includes power amplifiers 42A and 42B, low noise amplifiers 52A and 52B, switches 53A and 53B, filters 54A and 54B, diplexer 46, and antenna 47. The power amplifiers 42A and 42B can each transmit an amplified RF signal associated with a different carrier. The switch 53A can be a transmit/receive switch. The switch 53A can couple the filter 54A to an output of the power amplifier 42A in a transmit mode and to an input of the low noise amplifier 52A in a receive mode. The filter 54A and/or the filter 54B can be implemented in accordance with any suitable principles and advantages discussed herein. The diplexer 46 can combine RF signals from the power amplifiers 42A and 42B provided by the switches 53A and 53B into a carrier aggregation signal that is transmitted by the antenna 47. The diplexer 46 can isolate different frequency bands of a carrier aggregation signal received by the antenna 47. The switches 53A and 53B and the filters 54A and 54B can provide RF signals with the isolated frequency bands to respective low noise amplifiers 52A and 52B.

Figure 2C:
FIG. 2C is a schematic diagram of a carrier aggregation system.

FIG. 2C is a schematic diagram of a carrier aggregation system 60 that includes multiplexers in signal paths between power amplifiers and an antenna. The illustrated carrier aggregation system 60 includes a low band path, a medium band path, and a high band path. In certain implementations, a low band path can process radio frequency signals having a frequency of less than 1 GHZ, a medium band path can process radio frequency signals having a frequency between 1 GHz and 2.2 GHZ, and a high band path can process radio frequency signals having a frequency above 2.2 GHz.

A diplexer 46 can be included between the RF signal paths and an antenna 47. The diplexer 46 can frequency multiplex radio frequency signals that are relatively far away in frequency. The diplexer 46 can be implemented with passive circuit elements having a relatively low loss. The diplexer 46 can combine (for transmit) and separate (for receive) carriers of carrier aggregation signals.

As illustrated, the low band path includes a power amplifier 42A configured to amplify a low band radio frequency signal, a band select switch 43A, and a multiplexer 64A. The band select switch 43A can electrically connect the output of the power amplifier 42A to a selected transmit filter of the multiplexer 64A. The selected transmit filter can be a band pass filter with pass band corresponding to a frequency of an output signal of the power amplifier 42A. The multiplexer 64A can include any suitable number of transmit filters and any suitable number of receive filters. One or more of the transmit filters and/or one or more of the receive filters can be implemented in accordance with any suitable principles and advantages discussed herein. The multiplexer 64A can have the same number of transmit filters as receive filters. In some instances, the multiplexer 64A can have a different number of transmit filters than receive filters.

As illustrated in FIG. 2C, the medium band path includes a power amplifier 42B configured to amplify a medium band radio frequency signal, a band select switch 43B, and a multiplexer 64B. The band select switch 43B can electrically connect the output of the power amplifier 42B to a selected transmit filter of the multiplexer 64B. The selected transmit filter can be a band pass filter with pass band corresponding to a frequency of an output signal of the power amplifier 42B. The multiplexer 64B can include any suitable number of transmit filters and any suitable number of receive filters. One or more of the transmit filters and/or one or more of the receive filters can be implemented in accordance with any suitable principles and advantages discussed herein. The multiplexer 64B can have the same number of transmit filters as receive filters. In some instances, the multiplexer 64B can have a different number of transmit filters than receive filters.

In the illustrated carrier aggregation system 60, the high band path includes a power amplifier 42C configured to amplify a high band radio frequency signal, a band select switch 43C, and a multiplexer 64C. The band select switch 43C can electrically connect the output of the power amplifier 42C to a selected transmit filter of the multiplexer 64C. The selected transmit filter can be a band pass filter with pass band corresponding to a frequency of an output signal of the power amplifier 42C. The multiplexer 64C can include any suitable number of transmit filters and any suitable number of receive filters. One or more of the transmit filters and/or one or more of the receive filters can be implemented in accordance with any suitable principles and advantages discussed herein. The multiplexer 64C can have the same number of transmit filters as receive filters. In some instances, the multiplexer 64C can have a different number of transmit filters than receive filters.

A select switch 65 can selectively provide a radio frequency signal from the medium band path or the high band path to the diplexer 46. Accordingly, the carrier aggregation system 60 can process carrier aggregation signals with either a low band and high band combination or a low band and medium band combination.

Figure 2D:
FIG. 2D is a schematic diagram of a carrier aggregation system.

FIG. 2D is a schematic diagram of a carrier aggregation system 70 that includes multiplexers in signal paths between power amplifiers and an antenna. The carrier aggregation system 70 is like the carrier aggregation system 60 of FIG. 2C, except that the carrier aggregation system 70 includes switch-plexing features. Switch-plexing can be implemented in accordance with any suitable principles and advantages discussed herein.

Switch-plexing can implement on-demand multiplexing. Some radio frequency systems can operate in a single carrier mode for a majority of the time (e.g., about 95% of the time) and in a carrier aggregation mode for a minority of the time (e.g., about 5% of the time). Switch-plexing can reduce loading in a single carrier mode in which the radio frequency system can operate for the majority of the time relative to a multiplexer that includes filters having a fixed connection at a common node. Such a reduction in loading can be more significant when there are a relatively larger number of filters included in multiplexer.

In the illustrated carrier aggregation system 70, duplexers 64B and 64C are selectively coupled to a diplexer 46 by way of a switch 75. The switch 75 is configured as a multi-close switch that can have two or more throws active concurrently. Having multiple throws of the switch 75 active concurrently can enable transmission and/or reception of carrier aggregation signals. The switch 75 can also have a single throw active during a single carrier mode. As illustrated, each duplexer of the duplexers 44A is coupled to separate throws of the switch 75. Similarly, the illustrated duplexers 44B include a plurality of duplexers coupled to separate throws of the switch 75. Alternatively, instead of the duplexers being coupled to each throw the switch 75 as illustrated in FIG. 2D, one or more individual filters of a multiplexer can be coupled to a dedicated throw of a switch coupled between the multiplexer and a common node. For instance, in some implementations, such a switch could have twice as many throws as the illustrated switch 75.

Figures 3A, 3B:
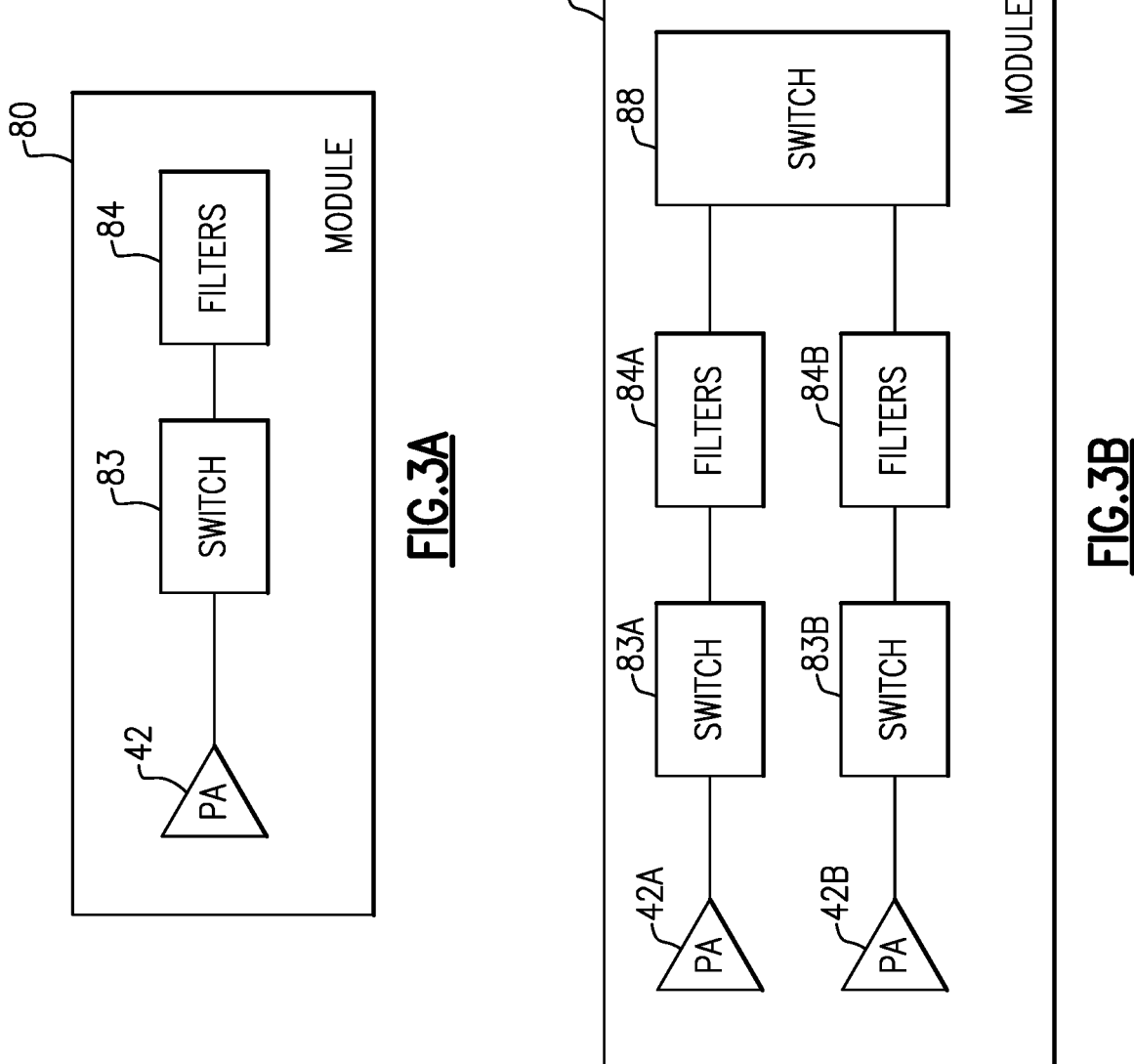
FIG. 3A is a schematic block diagram of a module that includes a filter.
FIG. 3B is a schematic block diagram of a module that includes a filter.

The filters discussed herein can be implemented in a variety of packaged modules. Some exemplary packaged modules will now be discussed in which any suitable principles and advantages of the filters discussed herein can be implemented. FIGS. 3A and 3B are schematic block diagrams of illustrative packaged modules according to certain embodiments.

FIG. 3A is a schematic block diagram of a module 80 that includes a power amplifier 42, a switch 83, and filters 84 in accordance with one or more embodiments. The module 80 can include a package that encloses the illustrated elements. The power amplifier 42, a switch 83, and filters 84 can be disposed on a common packaging substrate. The packaging substrate can be a laminate substrate, for example. The switch 83 can be a multi-throw radio frequency switch. The switch 83 can electrically couple an output of the power amplifier 42 to a selected filter of the filters 84. The filters 84 can include any suitable number of surface acoustic wave filters. One or more filters of the filters 84 can be implemented in accordance with any suitable principles and advantages disclosed herein.

FIG. 3B is a schematic block diagram of a module 85 that includes power amplifiers 42A and 42B, switches 83A and 83B, and filters 84A and 84B in accordance with one or more embodiments, and an antenna switch 88. The module 85 is like the module 80 of FIG. 3A, except the module 85 includes an additional RF signal path and the antenna switch 88 arranged to selectively couple a signal from the filters 84A or the filters 84B to an antenna node. One or more filters of the filters 84A and/or 84B can be implemented in accordance with any suitable principles and advantages disclosed herein. The additional RF signal path includes an additional power amplifier 42B, and additional switch 83B, and additional filters 84B. The different RF signal paths can be associated with different frequency bands and/or different modes of operation (e.g., different power modes, different signaling modes, etc.).

Film bulk acoustic wave resonators (FBARs) are a form of bulk acoustic wave resonator that generally includes a film of piezoelectric material sandwiched between a top and a bottom electrode and suspended over a cavity that allows for the film of piezoelectric material to vibrate. A signal applied across the top and bottom electrodes causes an acoustic wave to be generated in and travel through the film of piezoelectric material. A FBAR exhibits a frequency response to applied signals with a resonance peak determined by a thickness of the film of piezoelectric material. Ideally, the only acoustic wave that would be generated in a FBAR is a main acoustic wave that would travel through the film of piezoelectric material in a direction perpendicular to layers of conducting material forming the top and bottom electrodes. The piezoelectric material of a FBAR, however, typically has a non-zero Poisson's ratio. Compression and relaxation of the piezoelectric material associated with passage of the main acoustic wave may thus cause compression and relaxation of the piezoelectric material in a direction perpendicular to the direction of propagation of the main acoustic wave. The compression and relaxation of the piezoelectric material in the direction perpendicular to the direction of propagation of the main acoustic wave may generate transverse acoustic waves that travel perpendicular to the main acoustic wave (parallel to the surfaces of the electrode films) through the piezoelectric material. The transverse acoustic waves may be reflected back into an area in which the main acoustic wave propagates and may induce spurious acoustic waves travelling in the same direction as the main acoustic wave. These spurious acoustic waves may degrade the frequency response of the FBAR from what is expected or from what is intended and are generally considered undesirable.

In addition, solidly mounted resonators (SMR) are a type of film bulk acoustic resonators that may be utilized for microwave operation applications. ZnO piezoelectric films may be utilized in solidly mounted resonators, but show a low longitudinal acoustic velocity and a relatively low response.

Figures 4, 5:
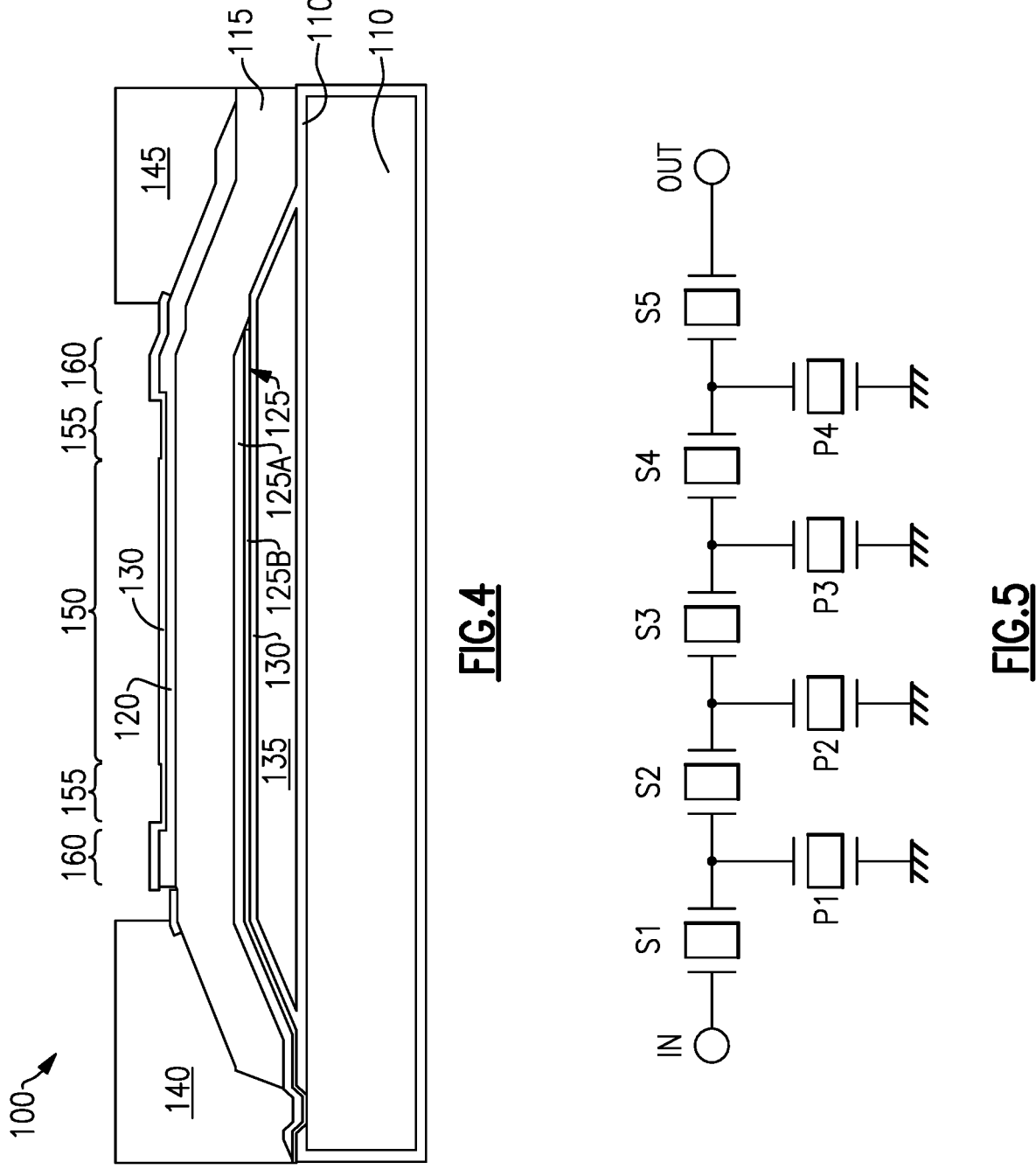
FIG. 4 is cross-sectional view of an example of a FBAR.
FIG. 5 illustrates an example of a ladder filter.

FIG. 4 is cross-sectional view of an example of a FBAR, indicated generally at 100. The FBAR 100 is disposed on a substrate 110, for example, a silicon substrate that may include a dielectric surface layer 110A of, for example, silicon dioxide. The FBAR 100 includes a layer or film of piezoelectric material 115, for example, aluminum nitride (AlN). A top electrode 120 is disposed on top of a portion of the layer or film of piezoelectric material 115 and a bottom electrode 125 is disposed on the bottom of a portion of the layer or film of piezoelectric material 115. The top electrode 120 may be formed of, for example, ruthenium (Ru). The bottom electrode 125 may include a layer 125A of Ru disposed in contact with the bottom of the portion of the layer or film of piezoelectric material 115 and a layer 125B of titanium (Ti) disposed on a lower side of the layer 125A of Ru opposite a side of the layer 125A of Ru in contact with the bottom of the portion of the layer or film of piezoelectric material 115. Each of the top electrode 120 and the bottom electrode 125 may be covered with a layer of dielectric material 130, for example, silicon dioxide. A cavity 135 is defined beneath the layer of dielectric material 130 covering the bottom electrode 125 and the surface layer 110A of the substrate 110. A bottom electrical contact 140 formed of, for example, copper may establish an electrical connection with the bottom electrode 125 and a top electrical contact 145 formed of, for example, copper may establish an electrical connection with the top electrode 120.

The FBAR 100 may include a central region 150 including a main active domain in the layer or film of piezoelectric material 115 in which a main acoustic wave is excited during operation. A recessed frame region or regions 155 may bound and define the lateral extent of the central region 150. The recessed frame region(s) 155 may be defined by areas that have a thinner layer of dielectric material 130 on top of the top electrode 120 than in the central region 150. The dielectric material layer 130 in the recessed frame region(s) 155 may be from about 10 nm to about 100 nm thinner than the dielectric material layer 130 in the central region 150. Additionally or alternatively, the difference in thickness of the dielectric material in the recessed frame region(s) 155 vs. in the central region 150 may cause the resonant frequency of the device in the recessed frame region(s) 155 to be between about 5 MHz to about 50 MHz higher than the resonant frequency of the device in the central region 150. A raised frame region or regions 160 may be defined on an opposite side of the recessed frame region(s) 155 from the central region 150 and may directly abut the outside edge(s) of the recessed frame region(s) 155. The raised frame region(s) 160 may be defined by areas where the top electrode 120 is thicker than in the central region 150 and in the recessed frame region(s) 155. The top electrode 120 may have the same thickness in the central region 150 and in the recessed frame region(s) 155 but a greater thickness in the raised frame region(s) 160. The top electrode 120 may be between about 50 nm and about 500 nm thicker in the raised frame region(s) 160 than in the central region 150 and/or in the recessed frame region(s) 155. The raised frame region(s) may be, for example, 4 μm or more in width.

The recessed frame region(s) 155 and the raised frame region(s) 160 may contribute to dissipation or scattering of transverse acoustic waves generated in the FBAR 100 during operation and/or may reflect transverse waves propagating outside of the recessed frame region(s) 155 and the raised frame region(s) 160 and prevent these transverse acoustic waves from entering the central region and inducing spurious signals in the main active domain region of the FBAR. Without being bound to a particular theory, it is believed that due to the thinner layer of dielectric material 130 on top of the top electrode 120 in the recessed frame region(s) 155, the recessed frame region(s) 155 may exhibit a higher velocity of propagation of acoustic waves than the central region 150. Conversely, due to the increased thickness and mass of the top electrode 120 in the raised frame region(s) 160, the raised frame regions(s) 160 may exhibit a lower velocity of propagation of acoustic waves than the central region 150 and a lower velocity of propagation of acoustic waves than the recessed frame region(s) 155. The discontinuity in acoustic wave velocity between the recessed frame region(s) 155 and the raised frame region(s) 160 creates a barrier that scatters, suppresses, and/or reflects transverse acoustic waves.

It should be appreciated that the FBAR illustrated in FIG. 4 and the FBARs and other structures illustrated in the other figures accompanying this disclosure are illustrated in a highly simplified form. The relative dimensions of the different features are not shown to scale. Further, embodiments of FBARs may include additional features or layers not illustrated or may lack one or more features or layers illustrated herein.

FBARs or other acoustic wave resonators may be combined to form a filter structure that may operate in the radio frequency (RF) band. One type of an acoustic wave resonator-based RF filter is known as a ladder filter.

FIG. 5 illustrates an example of a ladder filter. The filter of FIG. 5 includes a plurality of acoustic wave resonators S1, S2, S3, S4, S5 disposed in a series arm between an input port (IN) and an output port (OUT). Resonators S1, S2, S3, S4, and S5 are connected in series between the input port and output port. Resonators P1, P2, P3, and P4 are connected between nodes between adjacent ones of the series resonators S1, S2, S3, S4, and S5 and ground. Resonators P1, P2, P3, and P4 may be referred to as shunt resonators. In some embodiments, each of the series resonators S1, S2, S3, S4, and S5 may have the same resonant frequency. In some embodiments, each of the plurality of shunt resonators P1, P2, P3, and P4 have a resonant frequency below the resonant frequency of each of the series arm resonators S1, S2, S3, S4, and S5. At least one of the plurality of shunt resonators P1, P2, P3, and P4 may have a first resonant frequency different from resonant frequencies of others of the plurality of shunt resonators. At least one of the plurality of shunt resonators P1, P2, P3, and P4 may have a second resonant frequency different from the first resonant frequency and different from the resonant frequencies of others of the plurality of shunt resonators.

For ultrawide bandwidth filter implementations, for example, B41 full band (2,496 MHz to 2,690 MHz, a 7.5% relative bandwidth RBW), because the filter passband is so wide, the series resonators in a ladder filter for such implementations should desirably exhibit high admittance (e.g., the Y21 filter parameter) not only at the resonant frequency fs of the series resonators, but also at frequencies below, for example, 100 MHz, 120 MHz, or more below fs. A ladder filter as disclosed herein may have an RBW wider than 5.5% or wider than 7.5% to facilitate use in ultrawide bandwidth filter implementations. Typical FBAR resonators, for example, as illustrated in FIG. 4 may exhibit a degradation in admittance that is larger than desirable at frequencies below, for example, 100 MHz or more below fs and may thus not provide optimal functionality for filters intended for use in ultrawide bandwidth implementations, for example, for filters for the B41 full band. It has been discovered that the raised frame structure in a conventional FBAR may help increase the quality factor Q of the resonator but may degrade the admittance of the resonator at frequencies below fs of the resonator. A conventional raised frame structure may improve Y21 performance close to the fs of a FBAR, but not in a frequency range 100 MHz or more lower than the fs of the FBAR.

Figure 6:
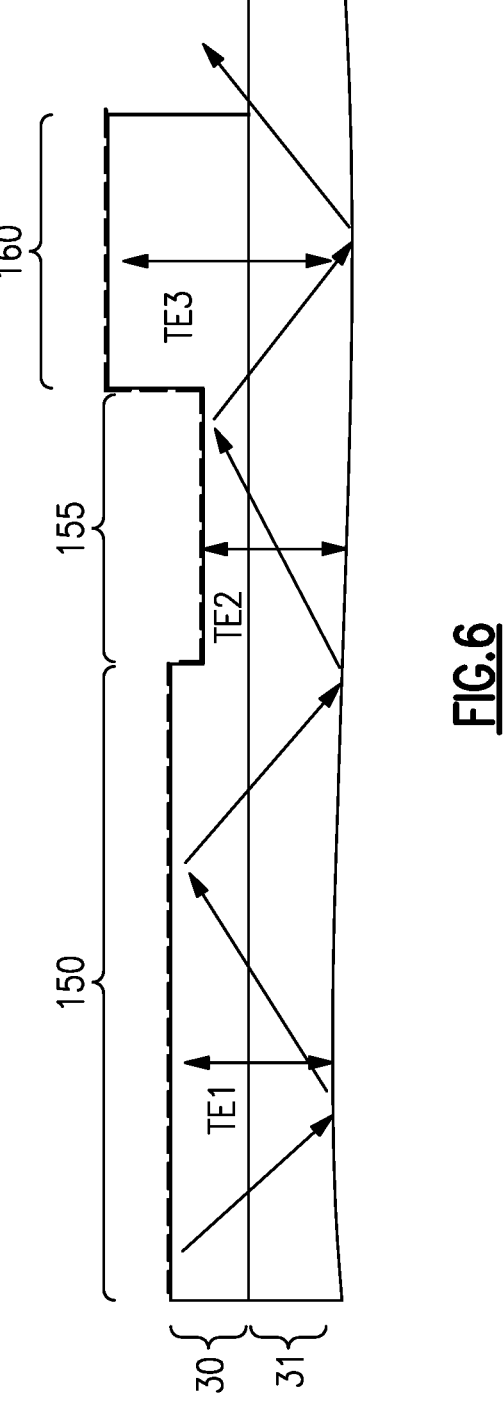
FIG. 6 is a highly schematic cross-sectional illustration of a portion of a film bulk acoustic wave resonator.

FIG. 6 is a highly schematic cross-sectional illustration of a portion of a film bulk acoustic wave resonator. In FIG. 6, upper region 30 represents a region including frames and may include the top electrode 120 and top dielectric material layer 130. Lower region 31 represents a region of the FBAR not including frames and may include film of piezoelectric material 115 and bottom electrode 125.

Figures 7A, 7B:
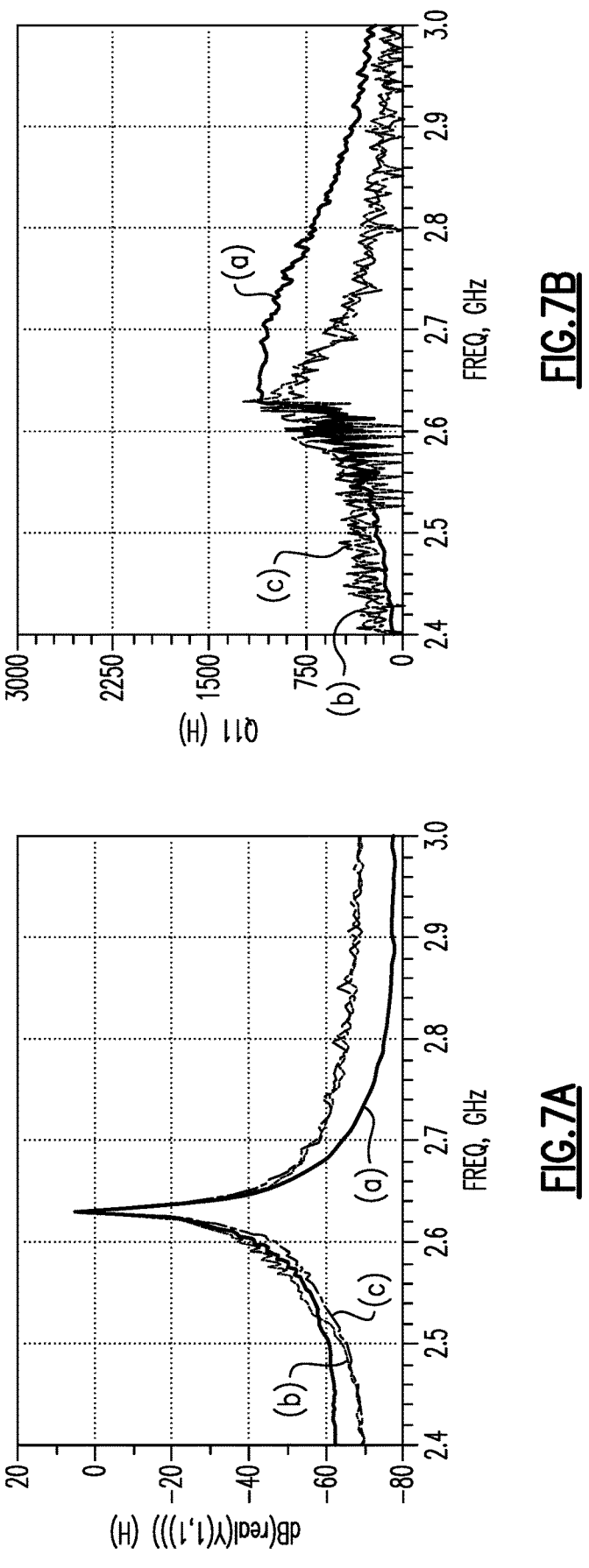
FIG. 7A is a measurement result of conductance of resonators with or without a raised frame region and/or a recessed frame region.
FIG. 7B is a measurement result of quality factors of resonators with or without a raised frame region and/or a recessed frame region.

FIG. 7A illustrates conductance of resonators with or without raised frame regions and/or recessed frame regions. FIG. 7B illustrates quality factors (Q) of resonators with or without raised frame regions and/or recessed frame regions. The quality factor (Q) of a resonator is expressed as the ratio of stored versus lost energy per oscillation cycle. Overall losses through a resonator increase as Q factor drops and will increase more rapidly with frequency for lower values of resonator Q. Each of the resonators may be one of a bulk acoustic wave (BAW) resonator, a film bulk acoustic wave resonator (FBAR), or a solidly mounted resonator (SMR).

Line (a) of FIGS. 7A and 7B represents the conductance of a resonator having both a raised frame region and a recessed frame region. Line (b) of FIGS. 7A and 7B represents the conductance of a resonator lacking both a raised frame region and a recessed frame region. Line (c) of FIGS. 7A and 7B represents the conductance of a resonator lacking a raised frame region and having a recessed frame region.

As shown in FIG. 7A, the resonator (a) having both a raised frame region and a recessed frame region shows improved conductance in a frequency region above its resonance frequency, while showing degraded conductance in a frequency region below its resonance frequency, compared to other resonators (b) and (c) without a raised frame region. In FIGS. 7A and 7B, the resonance frequency may be also referred to as fs for a series resonator where the magnitude of electrical impedance is minimum. In this simulation, the frequency fp where the magnitude of electrical impedance is maximum is positioned in a frequency region above the frequency fs. In a series resonator the frequency fp may be referred to as the anti-resonance frequency.

In FIG. 7B, it is shown that Q factor of resonator (a) having both a raised frame region and a recessed frame region is improved in the frequency region above fs, referred to as the fp region, compared to other resonators (b) and (c) without raised frame regions, whereas the Q factor of the resonator (a) is degraded in the frequency region below fs.

From this observation, it is understood that a resonator, such as BAW resonator or a FBAR, could use a raised frame to improve Qp in the fp frequency region, at the cost of Qs in the frequency region below fs. If the filter has a wide bandwidth, it could be beneficial to avoid using a raised frame so that the Q in the frequency region below fs can be maintained.

Due to the trade-off in Qp and Qs, it is desirable to determine which resonators should include raised frame regions and which resonator do not need to include raised frame regions for optimized filter performance. Similarly, it is desirable to determine whether to use a recessed frame region for each resonator.

Hereinafter, an acoustic wave filter operating with a broad bandwidth with an enhanced quality factor according to the present disclosure is provided. The acoustic wave filter may be a ladder-type filter as illustrated in FIG. 5, but the structure of the acoustic wave filter is not limited thereto.

According to an embodiment, an acoustic wave filter configured to allow signals to pass at a target passband includes an input port, an output port, a plurality of series resonators, and a plurality of shunt resonators. Each resonator of the plurality of series resonator and the plurality of shunt resonators is one of a bulk acoustic wave (BAW) resonator, a film bulk acoustic wave resonator (FBAR), or a solidly mounted resonator (SMR). The passband of the acoustic wave filter according to an embodiment of the present disclosure may be, for example, n77 or n79, or multi-frequency group wideband.

The plurality of series resonators is electrically connected in series between the input port and output port. The plurality of series resonators includes a first group of resonators and a second group of resonators. The first group of resonators and the second group of resonators can be distinguished from each other in whether the resonators have a raised frame region or not.

Each of the first group of resonators has a raised frame region (RaW). As described above with FIG. 4, the raised frame region may be defined by an area where at least one of a top electrode layer and a dielectric material layer on top of the top electrode layer is thicker than the one of the top electrode layer and the dielectric material layer an active region of the resonator, which is also referred to as the central region of the resonator. The raised frame region is configured to improve the quality (Q) factor of the resonator. More specifically, the raised frame region is configured to trap more energy within the active region, such to increase the ratio of stored versus lost energy per oscillation cycle.

Particularly, the first group of resonators are configured to improve Q factors of each resonator at a frequency region on a side of anti-resonance frequencies with respect to resonance frequencies of the resonators. That is, at the frequency region on a side of the anti-resonance frequency with respect to resonance frequency, the quality factor is improved by using a raised frame region. According to an embodiment described with respect to FIG. 7B, the Q factor of a resonator having a raised frame region is improved in a frequency region above the resonance frequency, whereas the Q factor of the resonator is degraded in a frequency region below the resonance frequency.

The second group of resonators does not have any raised frame region. The second group of resonators is configured to broaden a bandwidth of the target passband. Since the raised frame region improves the Q factor on one side with respect to the resonance frequency by sacrificing the Q factor on the other side of frequency region, providing series resonators lacking raised frame regions can compensate for the trade-off in Q factor depending on the frequency region.

The second group of resonators may include at least one resonator the resonance frequency of which is the closest among the plurality of series resonators to one edge of the target passband. The one edge of the target passband may be one boundary on a side of the anti-resonance frequencies of the second group of resonators. That is, the one edge of the target passband may be one boundary closer to the anti-resonance frequencies of the second group of resonators. According to an embodiment described with respect to FIG. 7B, the one boundary is an upper boundary which is closer to the anti-resonance frequency of each resonator of the second group of resonators than the lower boundary. The second group of resonators may include at least one resonator having the highest resonance frequency of all resonators in the acoustic wave filter. Since the second group of resonators have resonance frequencies close to the upper boundary of the target passband, the degradation of Q factor on the side of lower boundary is prevented, while the Q factor on the side of upper boundary is maintained.

The second group of resonators lacking any raised frame region includes more than one resonator (for example, two resonators) in order of closest distance in frequency between a respective resonance frequency and an upper edge of the target passband of the acoustic wave filter. Thus, the second group of resonators includes first and second resonators whose resonance frequencies are the closest and second closest to one edge of the passband. The number of resonators in the second group of resonators is not limited thereto, and it can vary depending on the design and desired performance of the acoustic filter.

Each of first group of resonators may have a recessed frame region (ReW). The recessed frame region may be defined by an area that has a thinner layer of dielectric material on top of the top electrode than the layer of dielectric material on top of the top electrode in the central region. The recessed frame region may be an area where the dielectric material layer on top of the top electrode layer is thinner than the dielectric material layer in the active region of the respective resonator.

The second group of resonators may not have any recessed frame region. Each resonator of the second group of resonators may not include a recessed frame region where the dielectric material layer on top of the top electrode layer is thinner than the dielectric material layer of the active region of a respective resonator in the second group of resonators. Alternatively, the second group of resonators may have recessed frame regions. That is, each resonator of the second group of resonators may include a recessed frame region where the dielectric material layer on top of the top electrode layer is thinner than the dielectric material layer in the active region of a respective resonator in the second group of resonators. The recessed frame region of each resonator of the second group of resonators is configured to further reduce insertion loss of the acoustic filter in the target passband.

Each of the shunt resonators is electrically connected between a node between respective adjacent series resonators and ground. For example, the acoustic filter may have shunt resonators connected to every node between adjacent series resonators, but the structure of acoustic filter is not limited thereto. An example of the acoustic filter is ladder-type resonator, but the structure of the acoustic filter is not limited thereto.

The plurality of shunt resonators may include a third group of resonators having raised frame regions and a fourth group of resonators lacking raised frame regions. Based on the idea that the resonance frequencies of the shunt resonators are important in defining the rejection band of the acoustic wave filter, some of the plurality of shunt resonators may have a raised frame region or a recessed frame region to enhance the frequency response in the rejection band.

For example, the fourth group of resonators may include at least one shunt resonator the resonance frequency of which is closest to one edge of the target passband to improve a response characteristic of the acoustic filter in a rejection band. For example, the fourth group of resonators may include at least one resonator having a lowest resonance frequency of all resonators in the filter.

According to embodiments of the present disclosure, a passband of an acoustic filter can be broadened by determining how many and which resonators do not have a raised frame region. In addition, the insertion loss of the acoustic filter can be further improved by configuring second groups of resonators to have recessed frame regions.

Figure 8:
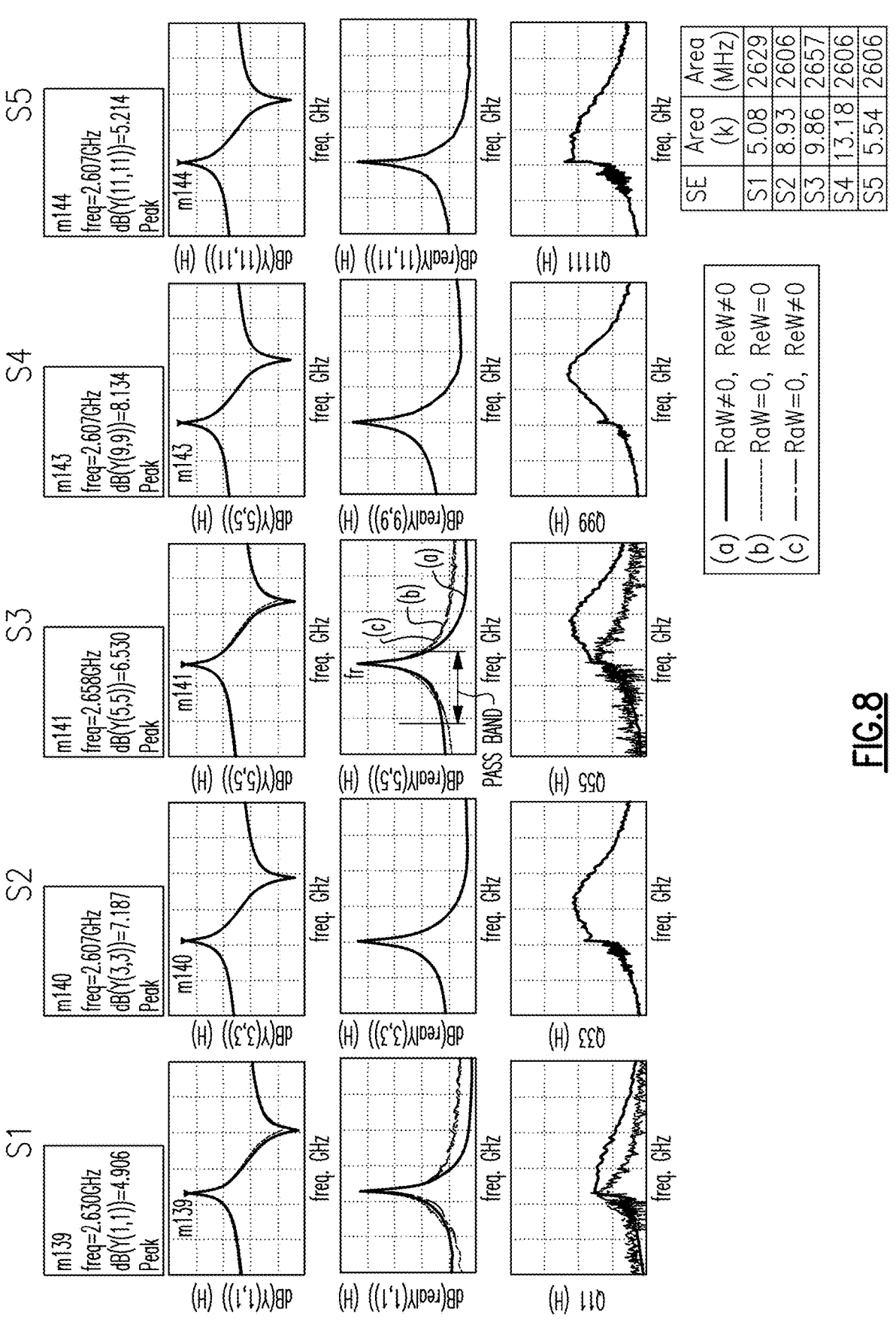
FIG. 8 illustrates frequency response of series resonators S1~S5 included in an acoustic filter according to an embodiment disclosure.

FIG. 8 illustrates the frequency response of series resonators S1~S5 included in an acoustic wave filter according to an embodiment of the present disclosure. According to an embodiment, the acoustic wave filter may have a structure as illustrated in FIG. 5. In this embodiment, the target passband of the acoustic wave filter may be between 2.496 GHz and 2.690 GHz.

Line (a) of FIG. 8 represents a frequency response of a resonator (S1 or S3) having both a raised frame region and a recessed frame region. Line (b) of FIG. 8 represents a frequency response of a resonator (S1 or S3) lacking both a raised frame region and a recessed frame region. Line (c) of FIG. 8 represents a frequency response of a resonator (S1 or S3) lacking a raised frame region and having a recessed frame region.

In this example, the resonator S1 has a resonance frequency of 2629 MHz, the resonator S2 has a resonance frequency of 2606 MHz, the resonator S3 has a resonance frequency of 2657 MHz, the resonator S4 has a resonance frequency of 2606 MHz, and the resonator S5 has a resonance frequency of 2606 MHz. According to an embodiment of the present disclosure, the resonators S1 and S3 belong to the second group of resonators, since the resonator S3 has resonance frequency closest to an upper boundary (2690 MHz) of the passband and the resonator S1 has a resonance frequency second closest to the upper boundary of the passband. As described above, the number of resonators in the second group of resonators may depend on the desired performance of the acoustic wave filter.

According to the conductance (real(Y(5,5))) of resonator S3, the difference in conductance between resonator (a) and resonators (b) and (c) at the upper boundary is small, whereas the difference in conductance at lower boundary is relatively large. That means that the improvement of Q factor in the frequency range above the resonance frequency of the resonator is maintained, while the degradation of Q factor in the frequency range below the resonance frequency is prevented.

Figure 9:
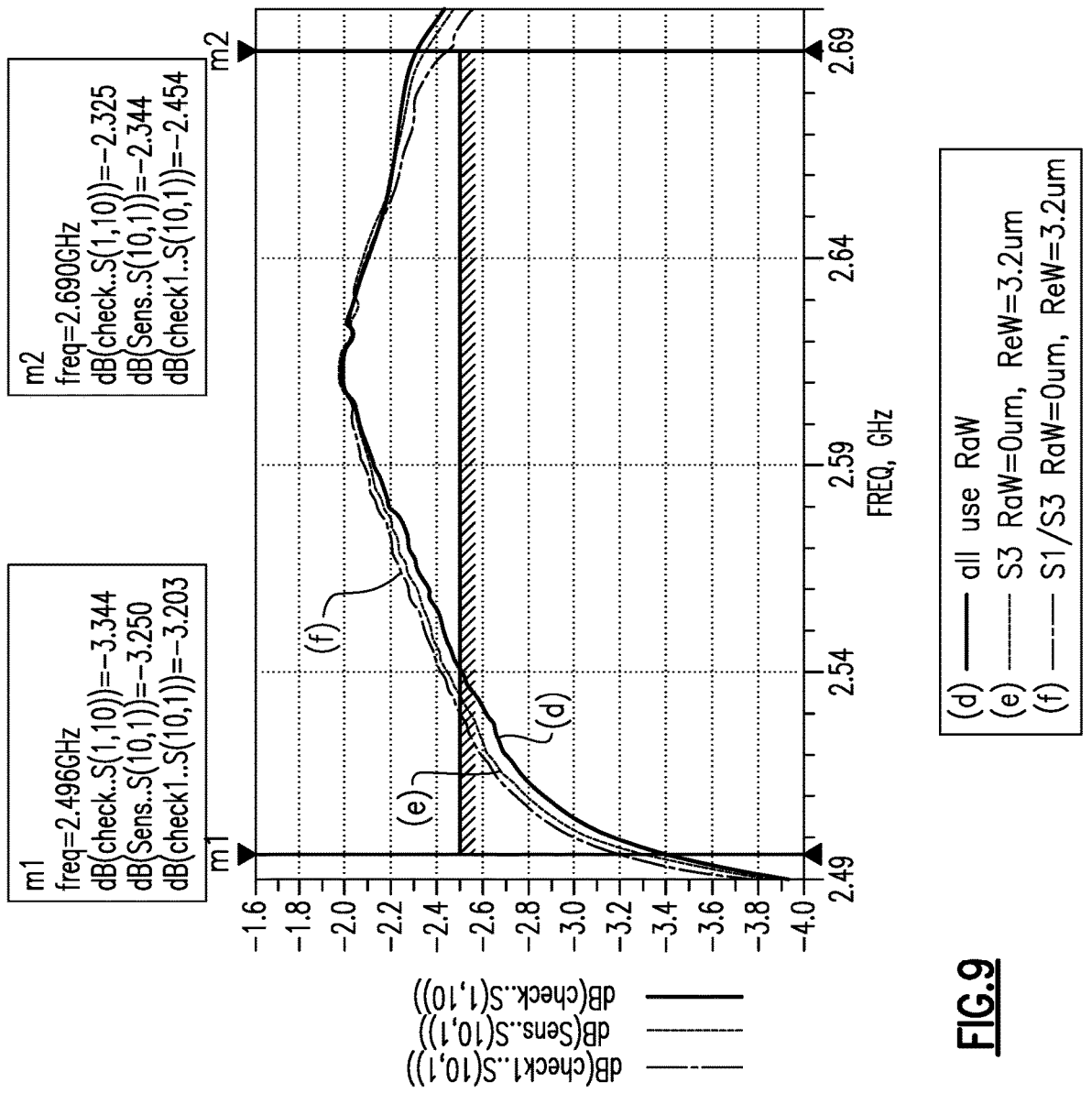
FIG. 9 illustrates bandwidth of passband of acoustic filter according to an embodiment of the present disclosure.

FIG. 9 illustrates the bandwidth of the passband of an acoustic wave filter according to an embodiment of the present disclosure.

Line (d) of FIG. 9 represents the frequency response (insertion loss) of the acoustic wave filter where all series resonators have both a raised frame region and a recessed frame region. Line (c) of FIG. 9 represents the frequency response of the acoustic wave filter where only the series resonator S3 lacks a raised frame region while other series resonators (S1, S2, S4, and S5) have raised frame regions. Line (f) of FIG. 9 represents the frequency response of an acoustic wave filter where resonators S1 and S3 do not have raised frame regions while the rest of the series resonators (S2, S4 and S5) have raised frame regions.

As shown in FIG. 9, the acoustic wave filter (e) has improved insertion loss at a lower boundary of the passband, while maintaining the frequency response at the upper boundary of the passband. The acoustic wave filter (f) has further improved insertion loss at the lower boundary of the passband, whereas the frequency response at the upper boundary of the passband has been slightly degraded. Therefore, the number of resonators in the second group of resonators can be determined based on the desired performance of the acoustic wave filter.

Figure 10A:
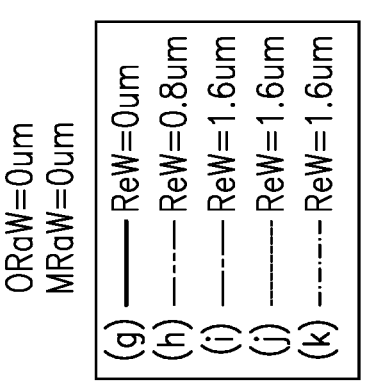
FIG. 10A illustrates frequency response of resonators having raised frame region depending on a thickness of dielectric material layer in recessed frame region (ReW) according to an embodiment of the present disclosure.
Figure 10A:
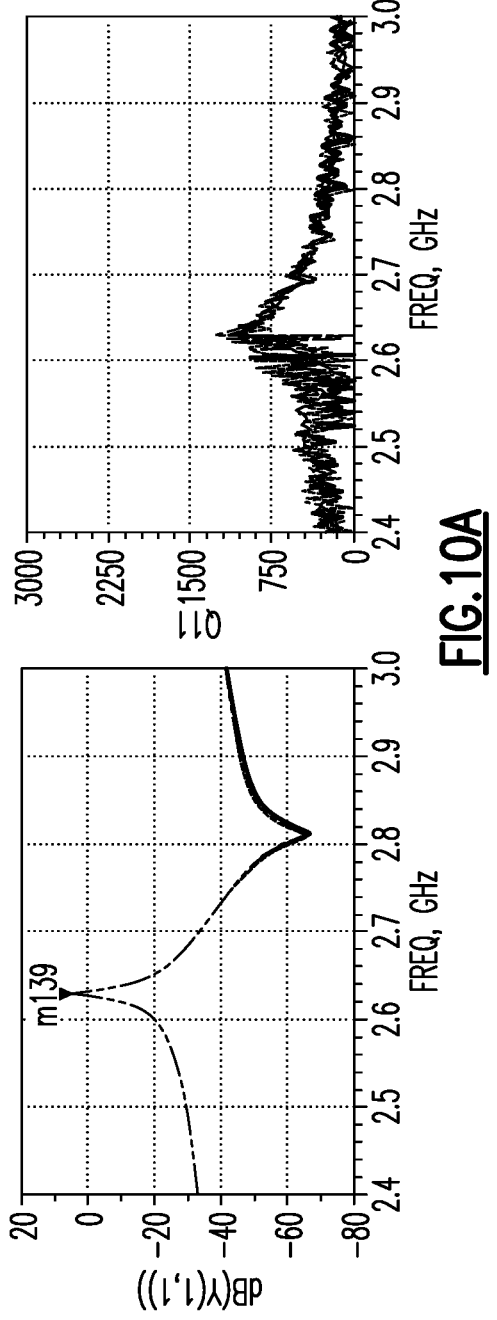
Figure 10B:
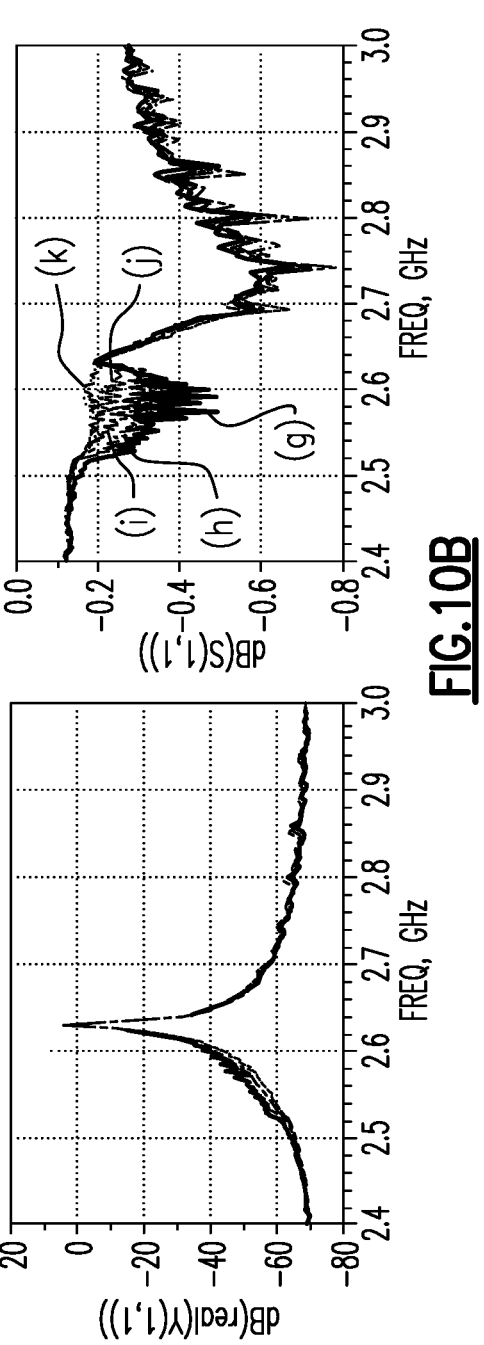
FIG. 10B illustrates conductance of resonators having raised frame region depending on a thickness of dielectric material layer in recessed frame region (ReW) according to an embodiment of the present disclosure.

FIG. 10A illustrates frequency responses of resonators having raised frame regions (RaW) depending on the thickness of the dielectric material layer in the recessed frame region (ReW) according to an embodiment of the present disclosure. FIG. 10B illustrates conductance of resonators having raised frame regions depending on the thickness of the dielectric material layer in the recessed frame region (ReW) according to an embodiment of the present disclosure.

As shown in FIGS. 10A and 10B, the performance of resonators having a raised frame region may be dependent on the thickness of the dielectric material layer in the recessed frame region. Therefore, the thickness of dielectric layer in recessed frame region can be selected based on the desired performance and design of the acoustic wave filters.

Figure 11:
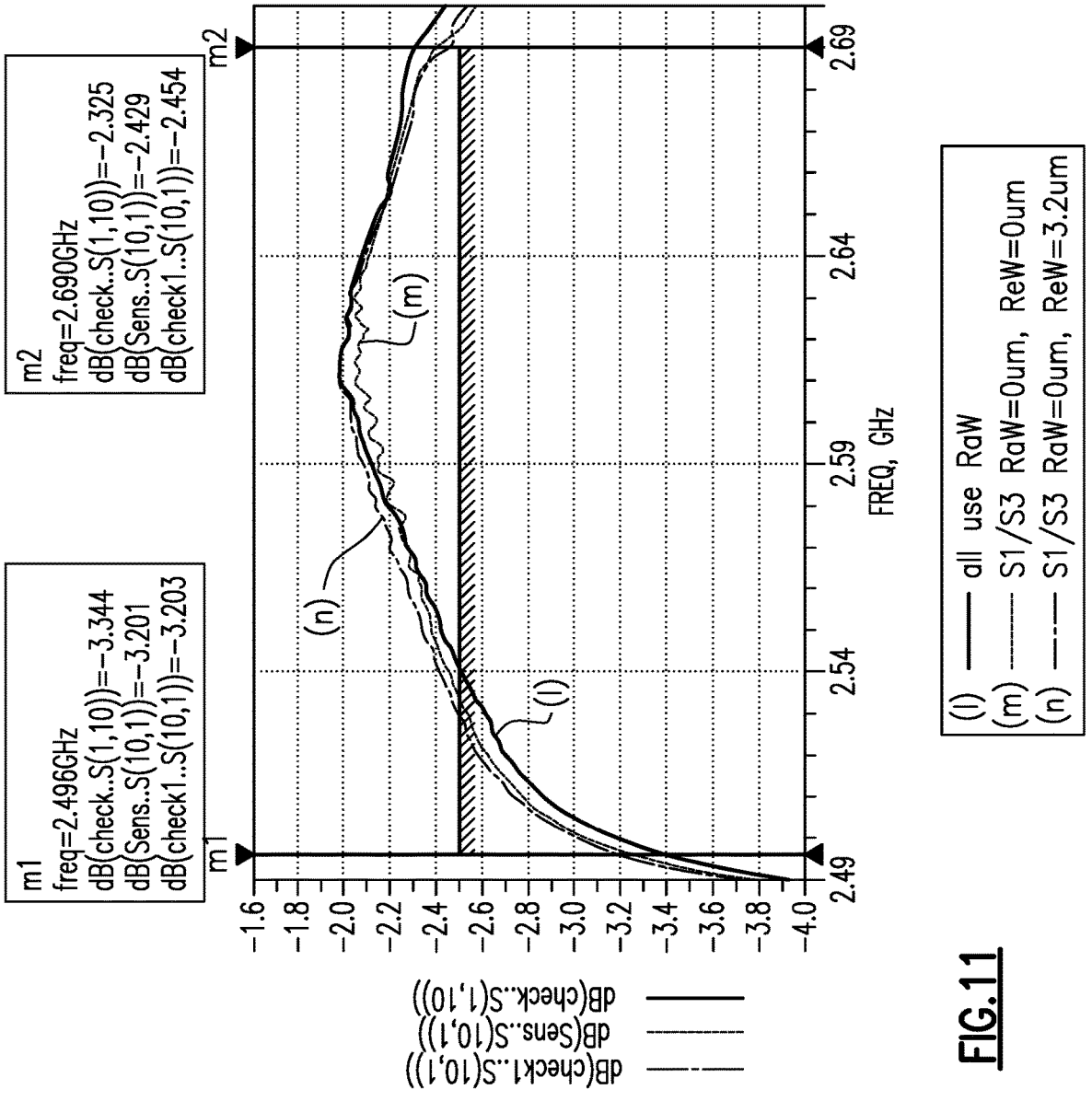
FIG. 11 illustrates frequency response (insertion loss) in the passband of the acoustic filter according to an embodiment of the present disclosure.

FIG. 11 illustrates the frequency response (insertion loss) in the passband of an acoustic wave filter according to an embodiment of the present disclosure.

Line (l) of FIG. 11 represents a frequency response (insertion loss) of the acoustic wave filter where all series resonators have both a raised frame region and a recessed frame region. Line (m) of FIG. 11 represents a frequency response of the acoustic wave filter where series resonators S1 and S3 lack both raised frame regions and recessed frame regions. Line (n) of FIG. 11 represents a frequency response of an acoustic wave filter where resonators S1 and S3 lack raised frame regions, but have recessed frame regions.

As shown in FIG. 11, the acoustic wave filter (m) has an improved frequency response, particularly in terms of bandwidth of the passband, compared to the acoustic wave filter (l). The acoustic wave filter (n) has a further improved frequency response, particularly in terms of reduced insertion loss in the middle of the passband, compared to the acoustic wave filters (l) and (m).

Figure 12:
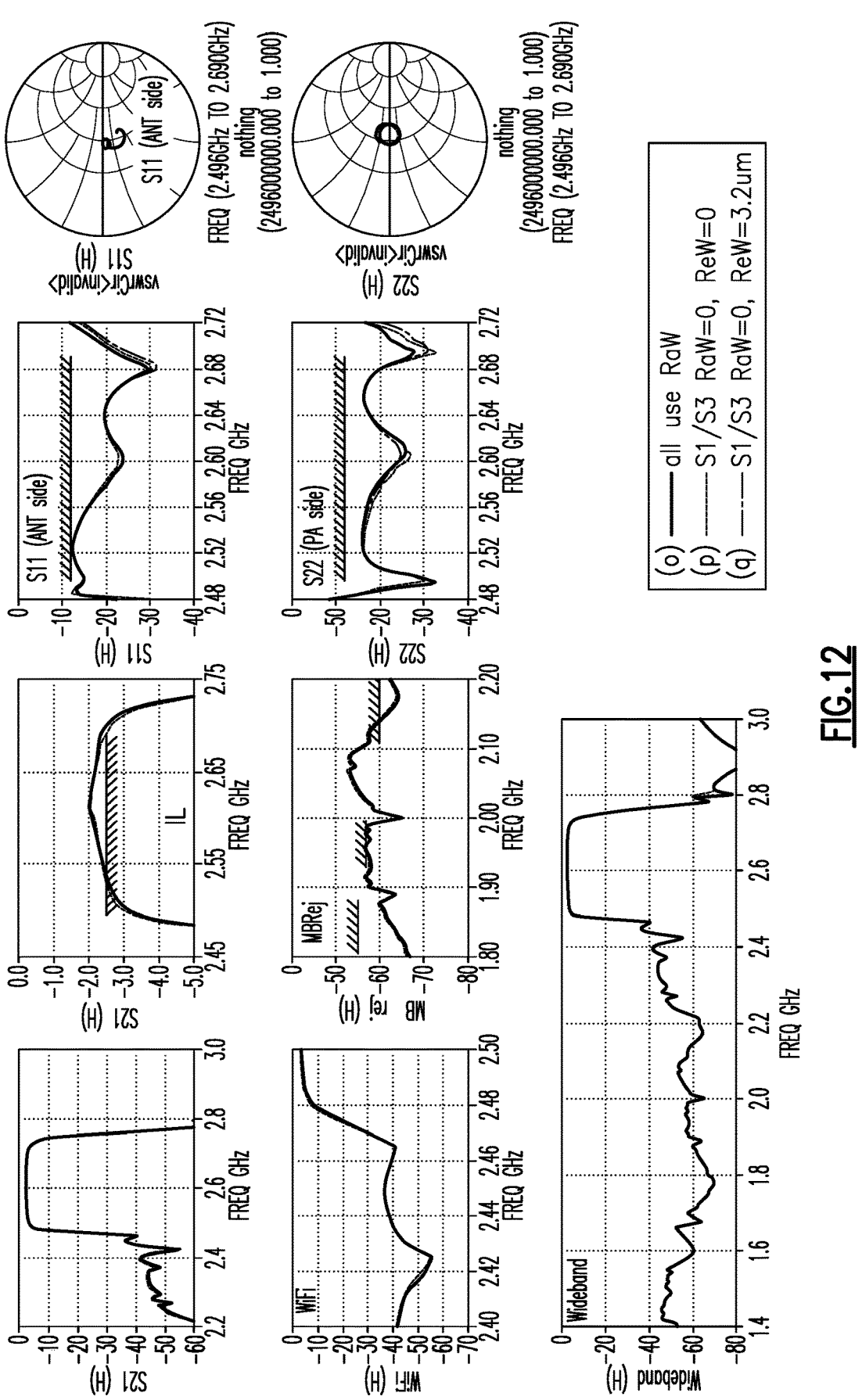
FIG. 12 illustrates characteristics of acoustic filter according to an embodiment of the present disclosure.

FIG. 12 illustrates characteristics of an acoustic wave filter according to an embodiment of the present disclosure.

Line (o) of FIG. 12 represents the frequency response (insertion loss) of the acoustic wave filter where all series resonators have both raised frame regions and a recessed frame regions. Line (p) of FIG. 12 represents a frequency response of the acoustic wave filter where series resonators S1 and S3 lack both raised frame regions and recessed frame regions. Line (q) of FIG. 12 represents a frequency response of an acoustic wave filter where resonators S1 and S3 lack raised frame regions, but have recessed frame regions.

As shown in FIG. 12, bandwidth (k2 value) and the insertion loss (IL) has been improved by configuring the second group of resonators (S1 and S3) without raised frame regions and recessed frame regions. The insertion loss has been further improved by configuring the second group of resonators without raised frame regions and without recessed frame regions. In addition, the FOM from the Smith chart has been also improved such as to vary in a smaller range.

Figure 13A:
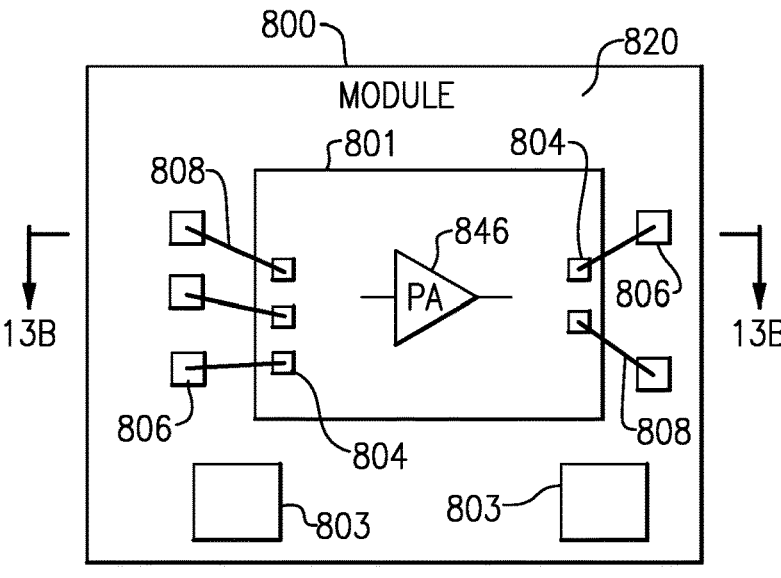
FIG. 13A is a schematic diagram of one embodiment of a packaged module.
Figure 13B:
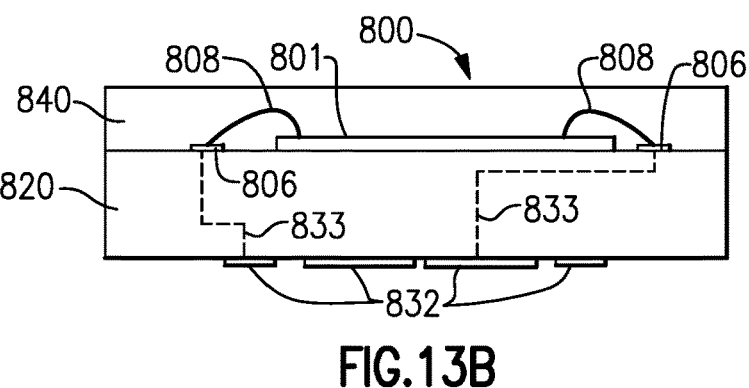
FIG. 13B is a schematic diagram of a cross-section of the packaged module of FIG. 13A taken along the lines 13B-13B.

FIG. 13A is a schematic diagram of one embodiment of a packaged module 800. FIG. 13B is a schematic diagram of a cross-section of the packaged module 800 of FIG. 13A taken along the lines 13B-13B.

The packaged module 800 includes an IC or die 801, surface mount components 803, wirebonds 808, a package substrate 820, and an encapsulation structure 840. The package substrate 820 includes pads 806 formed from conductors disposed therein. Additionally, the die 801 includes pads 804, and the wirebonds 808 have been used to electrically connect the pads 804 of the die 801 to the pads 806 of the package substrate 820.

The die 801 includes a filter module, which can be implemented in accordance with any of the embodiments disclosed herein.

The packaging substrate 820 can be configured to receive a plurality of components such as the die 801 and the surface mount components 803, which can include, for example, surface mount capacitors and/or inductors.

As shown in FIG. 13B, the packaged module 800 is shown to include a plurality of contact pads 832 disposed on the side of the packaged module 800 opposite the side used to mount the die 801. Configuring the packaged module 800 in this manner can aid in connecting the packaged module 800 to a circuit board such as a phone board of a wireless device. The example contact pads 832 can be configured to provide RF signals, bias signals, power low voltage(s) and/or power high voltage(s) to the die 801 and/or the surface mount components 803. As shown in FIG. 13B, the electrically connections between the contact pads 832 and the die 801 can be facilitated by connections 833 through the package substrate 820. The connections 833 can represent electrical paths formed through the package substrate 820, such as connections associated with vias and conductors of a multilayer laminated package substrate.

In some embodiments, the packaged module 800 can also include one or more packaging structures to, for example, provide protection and/or facilitate handling of the packaged module 800. Such a packaging structure can include an overmold or encapsulation structure 840 formed over the packaging substrate 820 and the components and die(s) disposed thereon.

It will be understood that although the packaged module 800 is described in the context of electrical connections based on wirebonds, one or more features of the present disclosure can also be implemented in other packaging configurations, including, for example, flip-chip configurations.

Figure 14:
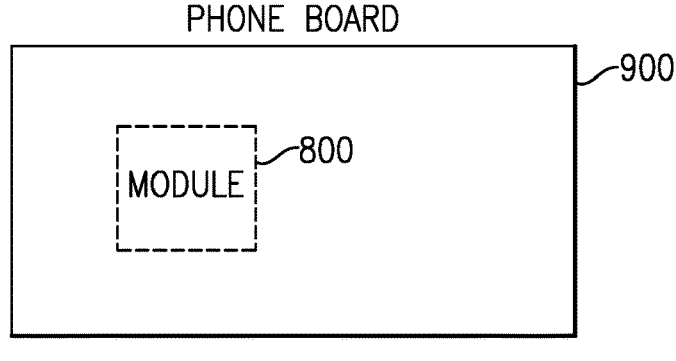
FIG. 14 is a schematic diagram of one embodiment of a phone board.

FIG. 14 is a schematic diagram of one embodiment of a phone board 900. The phone board 900 includes the module 800 shown in FIGS. 13A and 13B attached thereto. Although not illustrated in FIG. 14 for clarity, the phone board 800 can include additional components and structures.

Some of the embodiments described above have provided examples in connection with wireless devices or mobile phones. However, the principles and advantages of the embodiments disclosed herein can be used for any other systems or apparatus that have needs for acoustic wave filters.

Such acoustic wave filters can be implemented in various electronic devices. Examples of the electronic devices can include, but are not limited to, consumer electronic products, parts of the consumer electronic products, electronic test equipment, etc. Examples of the electronic devices can also include, but are not limited to, memory chips, memory modules, circuits of optical networks or other communication networks, and disk driver circuits. The consumer electronic products can include, but are not limited to, a mobile phone, a telephone, a television, a computer monitor, a computer, a hand-held computer, a personal digital assistant (PDA), a microwave, a refrigerator, an automobile, a stereo system, a cassette recorder or player, a DVD player, a CD player, a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used herein, shall refer to this disclosure as a whole and not to any particular portions of this disclosure. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of aspects and embodiments is not intended to be exhaustive or to limit this disclosure to the precise form disclosed above. While specific embodiments and examples are described above for illustrative purposes, various equivalent modifications are possible within the scope of the disclosure, as those skilled in the relevant art will recognize.

The teachings provided herein can be applied to other systems, not necessarily the system described above. The elements and acts of the various embodiments described above can be combined to provide further embodiments.

While certain embodiments have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure.

The accompanying claims and their equivalents are intended to cover such forms or modifications as would fall within the scope and spirit of the disclosure.

What is claimed is:

1. An acoustic wave filter configured to allow signals to pass at a target passband, the acoustic wave filter comprising:

an input port and an output port;

a plurality of series resonators electrically connected in series between the input port and the output port, the plurality of series resonators including a first group of resonators and a second group of resonators, each resonator of the first group of resonators having a quality (Q) factor, an anti-resonance frequency, a resonance frequency, and a raised frame region configured to improve the quality (Q) factor at a frequency on a side of the anti-resonance frequency with respect to the resonance frequency, each resonator of the second group of resonators having an anti-resonance frequency and a resonance frequency, the second group of resonators including at least one resonator having its resonance frequency closest to one edge of the target passband that is closer to the anti-resonance frequency of the at least one resonator than to the resonance frequency of the at least one resonator, the at least one resonator lacking any raised frame region; and a plurality of shunt resonators electrically connected between nodes between adjacent series resonators and a ground, some of the plurality of shunt resonators including recessed frame regions, the plurality of shunt resonators including a third group of resonators having raised frame regions and a fourth group of resonators lacking raised frame regions, at least one of the resonators of the fourth group of resonators having a lowest resonance frequency of all resonators in the acoustic wave filter.

2. The acoustic wave filter of claim 1 wherein each resonator of the plurality of series resonators and each resonator of the plurality of shunt resonators is one of a bulk acoustic wave (BAW) resonator, a film bulk acoustic wave resonator, or a solidly mounted resonator (SMR).

3. The acoustic wave filter of claim 1 wherein the second group of resonators lacking any raised frame region includes more than one resonator in order of closest distance in frequency between a respective resonance frequency of the more than one resonator and an upper edge of the target passband of the acoustic wave filter.

4. The acoustic wave filter of claim 1 wherein the raised frame region is defined by an area where at least a top electrode layer or a dielectric material layer on top of the top electrode layer is thicker than a top electrode layer or a dielectric material layer of an active region of a resonator in the first group of resonators.

5. The acoustic wave filter of claim 4 wherein each resonator in the first group of resonators includes a recessed frame region where the dielectric material layer on top of the top electrode layer is thinner than the dielectric material layer of the active region.

6. The acoustic wave filter of claim 4 wherein each resonator of the second group of resonators does not include a recessed frame region where the dielectric material layer on top of the top electrode layer is thinner than the dielectric material layer of the active region.

7. The acoustic wave filter of claim 4 wherein each resonator of the second group of resonators includes a recessed frame region where the dielectric material layer on top of the top electrode layer is thinner than the dielectric material layer of the active region such as to reduce insertion loss of the acoustic wave filter in the target passband.

8. The acoustic wave filter of claim 1 wherein the acoustic wave filter is ladder-type filter.

9. The acoustic wave filter of claim 1 wherein the third group of resonators includes at least one shunt resonator having a resonance frequency that is closest to one edge of the target passband such as to improve a response characteristic in a rejection band of the acoustic wave filter.

10. A mobile device comprising:

an antenna configured to receive a radio frequency signal; and a front end system configured to communicate with the antenna, the front end system including an acoustic wave filter configured to allow signals to pass at a target passband, the acoustic wave filter having an input port and an output port, a plurality of series resonators electrically connected in series between the input port and the output port, the plurality of series resonators including a first group of resonators and a second group of resonators, each resonator of the first group of resonators having a quality (Q) factor, an anti-resonance frequency, a resonance frequency, and a raised frame region configured to improve the quality (Q) factor at a frequency on a side of the anti-resonance frequency with respect to the resonance frequency, each resonator of the second group of resonators having an anti-resonance frequency and a resonance frequency, the second group of resonators including at least one resonator having its resonance frequency closest to one edge of the target passband that is closer to the anti-resonance frequency of the at least one resonator than to the resonance frequency of the at least one resonator, the at least one resonator lacking any raised frame region, and a plurality of shunt resonators connected in parallel, each of the shunt resonators being electrically connected between respective series resonators and a ground, some of the plurality of shunt resonators including recessed frame regions, the plurality of shunt resonators including a third group of resonators having raised frame regions and a fourth group of resonators lacking raised frame regions, at least one of the resonators of the fourth group of resonators having a lowest resonance frequency of all resonators in the acoustic wave filter.

11. A radio frequency module comprising:

a packaging substrate configured to receive a plurality of components; and an acoustic wave filter configured to allow signals to pass at a target passband implemented on the packaging substrate, the acoustic wave filter including an input port and an output port, a plurality of series resonators electrically connected in series between the input port and the output port, the plurality of series resonators including a first group of resonators and a second group of resonators, each resonator of the first group of resonators having a quality (Q) factor, an anti-resonance frequency, a resonance frequency, and a raised frame region configured to improve the quality (Q) factor at a frequency on a side of the anti-resonance frequency with respect to the resonance frequency, each resonator of the second group of resonators having an anti-resonance frequency and a resonance frequency, the second group of resonators including at least one resonator having its resonance frequency closest to one edge of the target passband that is closer to the anti-resonance frequency of the at least one resonator than to the resonance frequency of the at least one resonator, the at least one resonator lacking any raised frame region, and a plurality of shunt resonators, each of the shunt resonators being electrically connected between respective series resonators and a ground, some of the plurality of shunt resonators including recessed frame regions, the plurality of shunt resonators including a third group of resonators having raised frame regions and a fourth group of resonators lacking raised frame regions, at least one of the resonators of the fourth group of resonators having a lowest resonance frequency of all resonators in the acoustic wave filter.

12. The radio frequency module of claim 11 wherein the second group of resonators lacking any raised frame region includes more than one resonator in order of closest distance in frequency between a respective resonance frequency of the more than one resonator and an upper edge of the target passband of the acoustic wave filter.

13. The radio frequency module of claim 11 wherein the raised frame region is defined by an area where at least a top electrode layer and a dielectric material layer on top of the top electrode layer is thicker than a top electrode layer or a dielectric material layer of an active region of a resonator in the first group of resonators.

14. The radio frequency module of claim 13 wherein each resonator of the first group of resonators includes a recessed frame region where the dielectric material layer on top of the top electrode layer is thinner than the dielectric material layer of the active region of the resonator in the first group of resonators.

15. The radio frequency module of claim 13 wherein each resonator of the second group of resonators does not include a recessed frame region where the dielectric material layer on top of the top electrode layer is thinner than the dielectric material layer of the active region of a resonator in the second group of resonators.

16. The radio frequency module of claim 13 wherein each resonator of the second group of resonators includes a recessed frame region where the dielectric material layer on top of the top electrode layer is thinner than the dielectric material layer of the active region of a resonator in the second group of resonators such as to reduce insertion loss of the acoustic wave filter in the target passband.

17. The radio frequency module of claim 11 wherein the acoustic wave filter is ladder-type filter.

18. The radio frequency module of claim 11 wherein the third group of resonators includes at least one shunt resonator having a resonance frequency that is closest to one edge of the target passband such as to improve a response characteristic in a rejection band of the acoustic wave filter.

* * * * *